United States Patent
Terakawa et al.

(10) Patent No.: US 11,693,310 B2
(45) Date of Patent: Jul. 4, 2023

(54) BLUE CURABLE RESIN COMPOSITION, BLUE COLOR FILTER, AND DISPLAY DEVICE INCLUDING SAME

(71) Applicant: SUMITOMO CHEMICAL COMPANY, LIMITED, Tokyo (JP)

(72) Inventors: Takakiyo Terakawa, Osaka (JP); Hayato Hoshi, Tainan (TW); Jumpei Morimoto, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 248 days.

(21) Appl. No.: 16/761,533

(22) PCT Filed: Nov. 14, 2018

(86) PCT No.: PCT/JP2018/042097
§ 371 (c)(1),
(2) Date: May 5, 2020

(87) PCT Pub. No.: WO2019/098223
PCT Pub. Date: May 23, 2019

(65) Prior Publication Data
US 2020/0371435 A1    Nov. 26, 2020

(30) Foreign Application Priority Data
Nov. 16, 2017  (JP) ................. 2017-220998

(51) Int. Cl.
| | |
|---|---|
| G03F 7/00 | (2006.01) |
| G02B 5/22 | (2006.01) |
| G03F 7/004 | (2006.01) |
| G03F 7/029 | (2006.01) |
| C08F 2/44 | (2006.01) |
| C09B 67/22 | (2006.01) |
| C09B 47/04 | (2006.01) |

(52) U.S. Cl.
CPC .............. G03F 7/0007 (2013.01); C08F 2/44 (2013.01); C09B 47/04 (2013.01); C09B 67/0035 (2013.01); G02B 5/223 (2013.01); G03F 7/0045 (2013.01); G03F 7/0295 (2013.01)

(58) Field of Classification Search
CPC ...... C09B 67/0035; C09B 47/04; G02B 5/223
See application file for complete search history.

(56) References Cited

U.S. PATENT DOCUMENTS

| | | | | |
|---|---|---|---|---|
| 2008/0170187 A1* | 7/2008 | Shimizu | ................ | G03F 7/031 252/586 |
| 2010/0086868 A1* | 4/2010 | Metz | ...................... | C09D 7/41 524/88 |
| 2014/0346416 A1* | 11/2014 | Hsu | ...................... | G03F 7/105 252/586 |
| 2018/0095205 A1* | 4/2018 | Yamada | ............. | C09B 67/0035 |

FOREIGN PATENT DOCUMENTS

| | | | |
|---|---|---|---|
| CN | 1677138 A | 10/2005 | |
| CN | 107272337 A * | 10/2017 | ............ G02B 5/20 |
| JP | 09095638 A * | 4/1997 | |
| JP | 09197663 A * | 7/1997 | |
| JP | H11-72615 A | 3/1999 | |
| JP | 2005-316388 A | 11/2005 | |
| JP | 2005316388 A * | 11/2005 | |
| JP | 2010-032999 A | 2/2010 | |
| JP | 2012-088423 A | 5/2012 | |
| JP | 2012088423 A * | 5/2012 | |
| JP | 2015-189841 A | 11/2015 | |
| JP | 2015189841 A * | 11/2015 | |
| WO | WO-2016/163351 A1 | 10/2016 | |
| WO | WO-2016163351 A1 * | 10/2016 | ............ C09B 47/04 |

OTHER PUBLICATIONS

English translation of JP2012088423. (Year: 2012).*
English translation of JP2015189841. (Year: 2015).*
English translation of JP2005316388. (Year: 2005).*
English translation of ON 107272337. (Year: 2017).*
English translation of JP09197663. (Year: 1997).*
English translation of JP09095638. (Year: 1997).*
International Searching Authority, "International Search Report," issued in connection with International Patent Application No. PCT/JP2018/042097, dated Feb. 5, 2019.
International Searching Authority, "Written Opinion," issued in connection with International Patent Application No. PCT/JP2018/042097, dated Feb. 5, 2019.
Office Action issued in corresponding Taiwanese Patent Application No. 107140193 dated Jan. 24, 2022.

* cited by examiner

*Primary Examiner* — Chanceity N Robinson
*Assistant Examiner* — Anna Malloy
(74) *Attorney, Agent, or Firm* — Foley & Lardner LLP

(57) ABSTRACT

A blue curable resin composition includes a colorant (A), a resin (B), a polymerizable compound (C) and a polymerization initiator (D). The colorant (A) includes two or more pigments each having a phthalocyanine backbone. The blue curable resin composition has relatively low in Bx and is high in intensity in an xy chromaticity diagram of an XYZ color system. A color filter may be formed from the blue curable resin composition. The blue curable composition may be also used in a display device.

4 Claims, No Drawings

BLUE CURABLE RESIN COMPOSITION, BLUE COLOR FILTER, AND DISPLAY DEVICE INCLUDING SAME

CROSS-REFERENCE TO RELATED APPLICATIONS

The present application claims priority under 37 U.S.C. § 371 to International Patent Application No. PCT/JP2018/042097, filed Nov. 14, 2018, which claims priority to and the benefit of Japanese Patent Application No. 2017-220998, filed on Nov. 16, 2017. The contents of these applications are hereby incorporated by reference in their entireties.

TECHNICAL FIELD

The present invention relates to a blue curable resin composition, a blue color filter, and a display device including the same.

BACKGROUND ART

Liquid crystal display devices wide in displayable color reproduction range have been increasingly demanded in recent years.

Patent Literature 1 proposes a composition including a combination of C.I. Pigment Blue 15 and C.I. Pigment Violet 23. Patent Literature 2 proposes a composition including C.I. Pigment Blue 15:6 and a red dye.

CITATION LIST

Patent Literatures

Patent Literature 1: Japanese Patent Laid-Open No. 2005-316388
Patent Literature 2: Japanese Patent Laid-Open No. 2010-32999

SUMMARY OF INVENTION

Technical Problem

An object of the present invention is to provide a blue curable resin composition low in x and high in intensity in an xy chromaticity diagram of an XYZ color system, in order to obtain a display device wide in displayable color reproduction range, as well as a blue color filter formed from the blue curable resin composition, and a display device including the blue color filter.

Another object of the present invention is to provide a blue curable resin composition high in intensity in the case of constant x value and y value in an xy chromaticity diagram of an XYZ color system, as well as a blue color filter formed from the blue curable resin composition, and a display device including the blue color filter.

Solution to Problem

The present invention provides the following blue curable resin compositions, blue color filter and display device.
[1] A blue curable resin composition including a colorant (A), a resin (B), a polymerizable compound (C) and a polymerization initiator (D), wherein the colorant (A) includes two or more pigments each having a phthalocyanine backbone.
[2] The blue curable resin composition according to [1], wherein at least one of the two or more pigments each having the phthalocyanine backbone is a pigment selected from the group consisting of C.I. Pigment Blue 15, C.I. Pigment Blue 15:6, C.I. Pigment Blue 15:4 and C.I. Pigment Blue 16.
[3] The blue curable resin composition according to [1] or [2], wherein one of the two or more pigments each having the phthalocyanine backbone is C.I. Pigment Blue 15.
[4] A blue color filter formed from the blue curable resin composition according to any one of [1] to [3].
[5] A display device including the blue color filter according to any one of [1] to [4].

Advantageous Effects of Invention

The blue curable resin composition according to the present invention enables a blue color filter low in x and high in intensity in an xy chromaticity diagram of an XYZ color system, and a display device including the blue color filter to be provided.

Another object of the present invention is to provide a blue curable resin composition high in intensity in the case of constant x value and y value in an xy chromaticity diagram of an XYZ color system, as well as a blue color filter formed from the blue curable resin composition, and a display device including the blue color filter.

DESCRIPTION OF EMBODIMENTS

<Blue Curable Resin Composition>

The blue curable resin composition of the present invention includes a colorant (A), a resin (B), a polymerizable compound (C) and a polymerization initiator (D), in which the colorant (A) includes two or more pigments each having a phthalocyanine backbone.

The blue curable resin composition including two or more pigments each having a phthalocyanine backbone can allow for low x and high intensity in an xy chromaticity diagram of an XYZ color system.

Herein, "x" in an xy chromaticity diagram of an XYZ color system (hereinafter, also referred to as "x") means an x coordinate (x) of Blue in xy chromaticity coordinates (x, y) based on an XYZ color system according to the International Display Method established in 1931 by the International Commission on Illumination CIE (Commission Internationale de l'Eclairage).

In a case where "y" in an xy chromaticity diagram of an XYZ color system (hereinafter, also referred to as "y") is identical, lower x tends to result in higher saturation and tends to allow the displayable color reproduction range of a display device to be wider.

The "intensity" means the tristimulus value Y in the XYZ color system, and a higher Y value tends to result in a higher intensity.

The chromaticity coordinates and intensity in the xy chromaticity diagram of the XYZ color system are measured according to "(4) Chromaticity evaluation" described in Examples below.

The compounds herein exemplified for each component can be used singly or in combinations of two or more kinds thereof unless otherwise indicated.

[1] Colorant (A)

The colorant (A) in the blue curable resin composition according to the present invention includes two or more pigments each having a phthalocyanine backbone. The blue curable resin composition includes the colorant (A), and thus can be lower in x and higher in intensity and is useful as a material of a blue color filter for use in a display device.

In particular, it has been conventionally extremely difficult for a blue curable resin composition to be high in intensity (Y value) in the cases of constant x and y in an xy chromaticity diagram of an XYZ color system and a constant thickness of a cured film, and even a slightly higher intensity (Y value), for example, even a higher value by 0.1 allows a display device obtained to be significantly improved.

The present invention can provide a blue curable resin composition which includes two or more pigments each having a phthalocyanine backbone and thus is high in intensity (Y value) and wide in displayable color reproduction range.

Such a pigment having a phthalocyanine backbone, for use in the present invention, is generally a pigment having a peak of transmittance in the range from 400 to 500 nm.

Specific examples of such a pigment having a phthalocyanine backbone include C.I. Pigment Blue 15, C.I. Pigment Blue 15:1, C.I. Pigment Blue 15:3, C.I. Pigment Blue 15:4, C.I. Pigment Blue 15:6, and C.I. Pigment Blue 16. Such a pigment corresponds to a compound classified as Blue Pigment in the Color Index (C.I.: issued by The Society of Dyers and Colourists). Among them, C.I. Pigment Blue 15 is preferable. Accordingly, the colorant (A) preferably includes C.I. Pigment Blue 15 and a pigment having a phthalocyanine backbone, including a structure different from that of C.I. Pigment Blue 15, namely, one of the two or more pigments each having a phthalocyanine backbone is preferably C.I. Pigment Blue 15. In a case where the colorant (A) includes C.I. Pigment Blue 15 and a pigment having a phthalocyanine backbone different from that of C.I. Pigment Blue 15, namely, in a case where one of the two or more pigments each having a phthalocyanine backbone is C.I. Pigment Blue 15, the blue curable resin composition tends to be low in x and high in intensity.

In a preferable embodiment of the blue resin curable composition of the present invention, at least one of the two or more pigments each having a phthalocyanine backbone in the colorant (A) is preferably a pigment selected from the group consisting of C.I. Pigment Blue 15, C.I. Pigment Blue 15:6, C.I. Pigment Blue 15:4 and C.I. Pigment Blue 16.

The two or more pigments each having a phthalocyanine backbone in the colorant (A) may be, for example, any of a combination of C.I. Pigment Blue 15 and C.I. Pigment Blue 15:6, a combination of C.I. Pigment Blue 15 and C.I. Pigment Blue 16, a combination of C.I. Pigment Blue 15:6 and C.I. Pigment Blue 15:4, and a combination of C.I. Pigment Blue 15:6 and C.I. Pigment Blue 16, and are preferably any of a combination of C.I. Pigment Blue 15 and C.I. Pigment Blue 15:6, a combination of C.I. Pigment Blue 15:6 and C.I. Pigment Blue 15:4, and a combination of C.I. Pigment Blue 15:6 and C.I. Pigment Blue 16, more preferably a combination of C.I. Pigment Blue 15 and C.I. Pigment Blue 15:6 from the viewpoint of intensity and wideness of the displayable color reproduction range of the blue resin curable composition.

The colorant (A) includes the two or more pigments each having a phthalocyanine backbone. The total content of the pigments each having a phthalocyanine backbone in the colorant (A) is preferably 50 to 100% by mass, more preferably 70 to 100% by mass, further preferably 80 to 100% by mass, particularly preferably 90 to 100% by mass based on 100% by mass of the colorant (A).

In a case where the colorant (A) includes C.I. Pigment Blue 15 and a pigment having a phthalocyanine backbone, having a structure different from that of C.I. Pigment Blue 15, the content ratio of C.I. Pigment Blue 15 and the pigment having a phthalocyanine backbone, having a structure different from that of C.I. Pigment Blue 15 in the colorant (A) (C.I. Pigment Blue 15/pigment having phthalocyanine backbone, having structure different from that of C.I. Pigment Blue 15) is usually 0.01 to 20 on a mass basis, and is preferably 0.1 to 15, more preferably 0.2 to 10, further preferably 0.4 to 7 from the viewpoint of a tendency where x is lower and the intensity is higher.

The colorant (A) can include any colorant other than such a pigment having a phthalocyanine backbone. Such other colorant may be a pigment (hereinafter, also referred to as "other pigment") or a dye (hereinafter, also referred to as "other dye"), or both thereof. Such other colorants may be used singly or in combinations of two or more thereof. Examples of such other pigment include an organic pigment and an inorganic pigment, and include any compound classified as Pigment in the Color Index.

Any known dye can be used as such other dye, and examples thereof include a solvent dye, an acidic dye, a direct dye and a mordant dye. Examples of such a dye include any compound classified as having a hue, other than Pigment, in the Color Index, and any known dye described in the Dyeing Note (Shikisensha Co., Ltd.). Examples thereof include an azo dye, a cyanine dye, a triphenylmethane dye, a phthalocyanine dye, an anthraquinone dye, a naphthoquinone dye, a quinonimine dye, a methine dye, an azomethine dye, a squarylium dye, an acridine dye, a styryl dye, a coumarin dye, a quinoline dye and a nitro dye, as categorized in terms of a chemical structure. Among them, an organic solvent-soluble dye is preferable.

The colorant (A) can also include a compound having a xanthene backbone (hereinafter, also referred to as "xanthene dye"). Such a xanthene dye here used can be any commercially available xanthene dye (for example, "Chugai Aminol Fast Pink R-H/C" manufactured by Chugai Kasei Co., Ltd., or "Rhodamin 6G" manufactured by Taoka Chemical Co., Ltd.). Such a xanthene dye can also be synthesized with a commercially available xanthene dye as a starting material, with reference to Japanese Patent Laid-Open No. 2010-32999.

Specific examples of the xanthene dye include C.I. Acid Red dyes such as C.I. Acid Red 51 (hereinafter, the description of C.I. Acid Red is omitted and only the number is described, and the same is true on other dyes), 52, 87, 92, 94, 289 and 388; C.I. Acid Violet dyes such as C.I. Acid Violet 9, 30 and 102; C.I. Basic Red dyes such as C.I. Basic Red 1 (Rhodamine 6G), 2, 3, 4, 8, 10 and 11; C.I. Basic Violet dyes such as C.I. Basic Violet 10 (Rhodamine B), 11 and 25; C.I. Solvent Red dyes such as C.I. Solvent Red 218; C.I. Mordant Red dyes such as C.I. Mordant Red 27; C.I. Reactive Red dyes such as C.I. Reactive Red 36 (Rose Bengal B); Sulforhodamine G; a xanthene dye described in Japanese Patent Laid-Open No. 2010-32999; and a xanthene dye described in Japanese Patent No. 4492760.

The colorant (A) can include other blue colorant(s) (blue pigment and/or blue dye) other than the pigments each having a phthalocyanine backbone. Examples of such other blue pigment(s) can include C.I. Pigment Blue 60.

Examples of the blue dye include

C.I. Solvent Blue dyes such as C.I. Solvent Blue 4, 5, 14, 18, 35, 36, 37, 45, 58, 59, 59:1, 63, 67, 68, 69, 70, 78, 79, 83, 90, 94, 97, 98, 100, 101, 102, 104, 105, 111, 112, 122, 128, 132, 136 and 139;

C.I. Acid Blue dyes such as C.I. Acid Blue 1, 3, 5, 7, 9, 11, 13, 15, 17, 18, 22, 23, 24, 25, 26, 27, 29, 34, 38, 40, 41, 42, 43, 45, 48, 51, 54, 59, 60, 62, 70, 72, 74, 75, 78, 80, 82, 83, 86, 87, 88, 90, 90:1, 91, 92, 93, 93:1, 96, 99, 100, 102, 103, 104, 108, 109, 110, 112, 113, 117, 119, 120, 123, 126, 127, 129, 130, 131, 138, 140, 142, 143, 147, 150, 151, 154, 158, 161, 166, 167, 168, 170, 171, 175, 182, 183, 184, 187, 192, 199, 203, 204, 205, 210, 213, 229, 234, 236, 242, 243, 256, 259, 267, 269, 278, 280, 285, 290, 296, 315, 324:1, 335 and 340;

C.I. Direct Blue dyes such as C.I. Direct Blue 1, 2, 3, 6, 8, 15, 22, 25, 28, 29, 40, 41, 42, 47, 52, 55, 57, 71, 76, 77, 78, 80, 81, 84, 85, 86, 90, 93, 94, 95, 97, 98, 99, 100, 101, 106, 107, 108, 109, 113, 114, 115, 117, 119, 120, 137, 149, 150, 153, 155, 156, 158, 159, 160, 161, 162, 163, 164, 165, 166, 167, 168, 170, 171, 172, 173, 188, 189, 190, 192, 193, 194, 195, 196, 198, 199, 200, 201, 202, 203, 207, 209, 210, 212, 213, 214, 222, 225, 226, 228, 229, 236, 237, 238, 242, 243, 244, 245, 246, 247, 248, 249, 250, 251, 252, 256, 257, 259, 260, 268, 274, 275, and 293;

C.I. Disperse Blue dyes such as C.I. Disperse Blue 1, 14, 56 and 60;

C.I. Basic Blue dyes such as C.I. Basic Blue 1, 3, 5, 7, 9, 19, 21, 22, 24, 25, 26, 28, 29, 40, 41, 45, 47, 54, 58, 59, 60, 64, 65, 66, 67, 68, 81, 83, 88 and 89; and C.I. Mordant Blue dyes such as C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83 and 84.

In a case where the colorant (A) includes C.I. Pigment Blue 15, the content of C.I. Pigment Blue 15 in the colorant (A) is usually 1 to 99% by mass based on 100% by mass of the colorant (A), and is preferably 15 to 95% by mass, more preferably 30 to 90% by mass from the viewpoint that the intensity of the structure tends to be high.

In a case where the colorant (A) includes C.I. Pigment Blue 15:6, the content of C.I. Pigment Blue 15:6 in the colorant (A) may be, for example, 1 to 99% by mass, and is preferably 5 to 95% by mass, more preferably 8 to 92% by mass based on 100% by mass of the colorant (A).

In a case where the colorant (A) includes C.I. Pigment Blue 15:4, the content of C.I. Pigment Blue 15:4 in the colorant (A) may be, for example, 1 to 99% by mass, and is preferably 5 to 95% by mass, more preferably 8 to 92% by mass based on 100% by mass of the colorant (A).

In a case where the colorant (A) includes C.I. Pigment Blue 16, the content of C.I. Pigment Blue 16 in the colorant (A) is, for example, 1 to 99% by mass, preferably 5 to 95% by mass, more preferably 8 to 92% by mass based on 100% by mass of the colorant (A).

In a case where the colorant (A) is a combination of C.I. Pigment Blue 15 and C.I. Pigment Blue 15:6, the mass ratio of C.I. Pigment Blue 15 and C.I. Pigment Blue 15:6 may be, for example, 0.1:99.9 to 99.9:0.1, and is preferably 0.5:99.5 to 99.5:0.5, more preferably 1:99 to 99:1, further preferably 5:95 to 95:5.

In a case where the colorant (A) is a combination of C.I. Pigment Blue 15 and C.I. Pigment Blue 16, the mass ratio of C.I. Pigment Blue 15 and C.I. Pigment Blue 16 may be, for example, 0.1:99.9 to 99.9:0.1, and is preferably 0.5:99.5 to 99.5:0.5, more preferably 1:99 to 99:1, further preferably 5:95 to 95:5.

In a case where the colorant (A) is a combination of C.I. Pigment Blue 15:6 and C.I. Pigment Blue 15:4, the mass ratio of C.I. Pigment Blue 15:6 and C.I. Pigment Blue 15:4 may be, for example, 0.1:99.9 to 99.9:0.1, and is preferably 0.5:99.5 to 99.5:0.5, more preferably 1:99 to 99:1, further preferably 5:95 to 95:5.

In a case where the colorant (A) is a combination of C.I. Pigment Blue 15:6 and C.I. Pigment Blue 16, the mass ratio of C.I. Pigment Blue 15:6 and C.I. Pigment Blue 16 may be, for example, 0.1:99.9 to 99.9:0.1, and is preferably 0.5:99.5 to 99.5:0.5, more preferably 1:99 to 99:1, further preferably 5:95 to 95:5.

The total content of the colorant (A) in the blue curable resin composition is usually 10 to 50% by mass in 100% by mass of the solid content of the blue curable resin composition, and is preferably 15% by mass or more, more preferably 20 to 40% by mass, further preferably 25 to 35% by mass from the viewpoint of a tendency where x is lower and the intensity is higher. The total content in 100% by mass of the solid content of the blue curable resin composition is preferably 45% by mass or less from the viewpoint of ease of formation of a resist pattern.

According to the present invention, the total content of the colorant (A) can be a proper amount, thereby allowing a blue color filter low in x and high in intensity to be formed with deterioration or the like in pattern shape being suppressed.

Herein, the "solid content of the blue curable resin composition" refers to the total component other than the solvent (E), among the components included in the blue curable resin composition.

Such various pigments for use in preparation of the blue curable resin composition are each preferably in the form of a dispersion thereof uniformly dispersed in a solvent. Such a pigment is preferably uniform in particle size. The dispersion can be obtained by mixing such a pigment and a solvent. A pigment dispersant may be, if necessary, mixed. A pigment dispersant can be contained and a dispersing treatment can be performed, thereby providing a pigment dispersion where such a pigment is uniformly dispersed in the solvent.

The pigment dispersant here used can be a commercially available surfactant, and examples thereof include silicone-based, fluorine-based, ester-based (including polyester-based one), cationic, anionic, nonionic, amphoteric, polyester-based, polyamine-based, and acrylic surfactants. Specific examples of the surfactant include not only a polyoxyethylene alkyl ether compound, a polyoxyethylene alkyl phenyl ether compound, a polyethylene glycol diester compound, a sorbitan fatty acid ester compound, a fatty acid-modified polyester compound, a tertiary amine-modified polyurethane compound and a polyethyleneimine compound, but also trade names KP (manufactured by Shin-Etsu Chemical Co., Ltd.), Floren (manufactured by Kyoeisha Chemical Co., Ltd.), Solsperse (manufactured by Zeneca), EFKA (manufactured by BASF Japan Ltd.), Ajisper (registered trademark) (manufactured by Ajinomoto Fine-Techno Co., Inc.) and Disperbyk (manufactured by BYK). Such pigment dispersants may be used singly or in combinations of two or more thereof.

In a case where the pigment dispersant is used, the amount thereof used is preferably 100 parts by mass or less, more preferably 5 to 50 parts by mass based on 100 parts by mass of the pigment. In a case where the amount of the pigment dispersant used falls within the range, a pigment dispersion in the form of a uniform dispersion is likely to be easily obtained.

The solvent constituting the pigment dispersion is not particularly limited, and examples thereof include the same solvent as a solvent (E) which can be contained in the blue curable resin composition, described below. In particular, the solvent is propylene glycol monomethyl ether acetate, ethyl lactate, propylene glycol monomethyl ether, ethyl 3-ethoxypropionate, ethylene glycol monomethyl ether, diethylene glycol monomethyl ether, diethylene glycol monoethyl ether, 3-methoxybutyl acetate, 3-methoxy-1-butanol, 4-hydroxy-4-methyl-2-pentanone, N,N-dimethylformamide or the like, preferably propylene glycol monomethyl ether acetate, propylene glycol monomethyl ether, dipropylene glycol methyl ether acetate, ethyl lactate, 3-methoxybutyl acetate, 3-methoxy-1-butanol, ethyl 3-ethoxypropionate or the like.

The amount of the solvent used is not particularly limited, and is any amount so that the concentration of the solid content in the pigment dispersion is preferably 5 to 30% by mass, more preferably 10 to 25% by mass.

Such various pigments for use in preparation of the blue curable resin composition may be, if necessary, subjected to a rosin treatment, a surface treatment with a pigment derivative, a pigment dispersant or the like into which an acidic group or a basic group is introduced, a graft treatment onto the surface of such a pigment with a polymer compound or the like, an atomization treatment according to a sulfuric acid atomization method or the like, a washing treatment with an organic solvent, water or the like for removal of impurities, a removal treatment according to an ion exchange method of ionic impurities, or the like.

[2] Resin (B)

The blue curable resin composition of the present invention contains one or more resins (B). Such a resin (B) is preferably an alkali-soluble resin. The "alkali-soluble" refers to any characteristic which allows for dissolution in a developer as an aqueous alkali compound. Examples of such a resin (B) include the following resins [K1] to [K6].

Resin [K1]: a copolymer of at least one (a) selected from the group consisting of an unsaturated carboxylic acid and an unsaturated carboxylic anhydride [hereinafter, sometimes referred to as "(a)".], and a monomer (b) having a cyclic ether structure having 2 to 4 carbon atoms and an ethylenically unsaturated bond [hereinafter, sometimes referred to as "(b)"].

Resin [K2]: a copolymer of (a), (b) and a monomer (c) (provided that (a) is different from (b)) copolymerizable with (a) [hereinafter, sometimes referred to as "(c)".].

Resin [K3]: a copolymer of (a) and (c).

Resin [K4]: a resin obtained by a reaction of a copolymer of (a) and (c) with (b).

Resin [K5]: a resin obtained by a reaction of a copolymer of (b) and (c) with (a).

Resin [K6]: a resin obtained by a reaction of a copolymer of (b) and (c) with (a) and furthermore a reaction of the resultant with a carboxylic anhydride.

Specific examples of (a) include unsaturated monocarboxylic acids such as (meth)acrylic acid, crotonic acid and o-, m-, and p-vinylbenzoic acids;

unsaturated dicarboxylic acids such as maleic acid, fumaric acid, citraconic acid, mesaconic acid, itaconic acid, 3-vinylphthalic acid, 4-vinylphthalic acid, 3,4,5,6-tetrahydrophthalic acid, 1,2,3,6-tetrahydrophthalic acid, dimethyltetrahydrophthalic acid and 1, 4-cyclohexenedicarboxylic acid;

carboxy group-containing bicyclo unsaturated compounds such as methyl-5-norbornene-2,3-dicarboxylic acid, 5-carboxybicyclo[2.2.1]hept-2-ene, 5,6-dicarboxybicyclo [2.2.1]hept-2-ene, 5-carboxy-5-methylbicyclo[2.2.1]hept-2-ene, 5-carboxy-5-ethylbicyclo[2.2.1]hept-2-ene, 5-carboxy-6-methylbicyclo[2.2.1]hept-2-ene and 5-carboxy-6-ethylbicyclo[2.2.1]hept-2-ene;

unsaturated dicarboxylic anhydrides such as maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride and 5,6-dicarboxybicyclo[2.2.1]hept-2-ene anhydride (himic anhydride);

unsaturated mono[(meth)acryloyloxy alkyl] esters of di- or higher valent, polyvalent carboxylic acids, such as mono [2-(meth)acryloyloxyethyl] succinate and mono[2-(meth) acryloyloxyethyl] phthalate; and unsaturated (meth)acrylic acids containing a hydroxy group and a carboxy group in the same molecule, such as α-(hydroxymethyl) (meth)acrylic acid.

Among them, (a) is preferably (meth)acrylic acid, maleic anhydride or the like from the viewpoint of copolymerization reactivity and from the viewpoint of solubility in an aqueous alkaline solution.

Herein, "(meth)acrylic" represents at least one selected from the group consisting of acrylic and methacrylic. The same is true on the designations "(meth)acryloyl", "(meth) acrylate", and the like.

(b) refers to a polymerizable compound having a cyclic ether structure (for example, at least one selected from the group consisting of an oxirane ring, an oxetane ring and a tetrahydrofuran ring (oxolane ring)) having 2 to 4 carbon atoms and an ethylenically unsaturated bond. (b) preferably corresponds to a monomer having a cyclic ether structure having 2 to 4 carbon atoms and a (meth)acryloyloxy group.

Examples of (b) include a monomer (b1) having an oxiranyl group and an ethylenically unsaturated bond [hereinafter, sometimes referred to as "(b1)".], a monomer (b2) having an oxetanyl group and an ethylenically unsaturated bond [hereinafter, sometimes referred to as "(b2)".], and a monomer (b3) having a tetrahydrofuryl group and an ethylenically unsaturated bond [hereinafter, sometimes referred to as "(b3)".].

Examples of (b1) include a monomer (b1-1) having a structure obtained by epoxidation of an unsaturated aliphatic hydrocarbon [hereinafter, sometimes referred to as "(b1-1)".] and a monomer (b1-2) having a structure obtained by epoxidation of an unsaturated alicyclic hydrocarbon [hereinafter, sometimes referred to as "(b1-2)"].

Examples of (b1-1) include glycidyl (meth)acrylate, β-methylglycidyl (meth) acrylate, β-ethylglycidyl (meth) acrylate, glycidyl vinyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-bis(glycidyloxymethyl)styrene, 2,4-bis(glycidyloxymethyl)styrene, 2,5-bis(glycidyloxymethyl)styrene, 2,6-bis(glycidyloxymethyl)styrene, 2,3,4-tris(glycidyloxymethyl)styrene, 2,3,5-tris(glycidyloxymethyl)styrene, 2,3,6-tris(glycidyloxymethyl)styrene, 3,4,5-tris(glycidyloxymethyl)styrene and 2,4,6-tris(glycidyloxymethyl)styrene.

Examples of (b1-2) include vinylcyclohexene monoxide, 1,2-epoxy 4-vinylcyclohexane (for example, Celloxide 2000; manufactured by Daicel Corporation), 3,4-epoxycyclohexylmethyl (meth)acrylate (for example, Cyclomer A400; manufactured by Daicel Corporation), 3,4-epoxycyclohexylmethyl (meth)acrylate (for example, Cyclomer M100; manufactured by Daicel Corporation), a compound represented by formula (I) and a compound represented by formula (II).

[Formula 1]

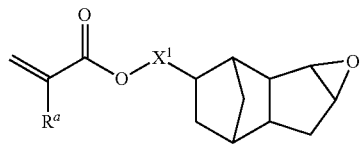
(I)

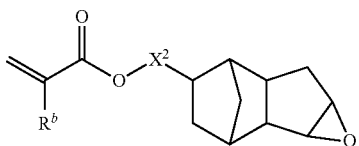
(II)

In formula (I) and formula (II), $R^a$ and $R^b$ each independently represent a hydrogen atom or an alkyl group having 1 to 4 carbon atoms, and a hydrogen atom contained in the alkyl group is optionally substituted with a hydroxy group; $X^1$ and $X^2$ each independently represent a single bond, *—$R^c$—, *—$R^c$—O—, *—$R^c$—S— or *—$R^c$—NH—; $R^c$ represents an alkanediyl group having 1 to 6 carbon atoms; and * represents a point to attachment to O.

Examples of the alkyl group having 1 to 4 carbon atoms include a methyl group, an ethyl group, a n-propyl group, an isopropyl group, a n-butyl group, a sec-butyl group and a tert-butyl group.

Examples of such an alkyl group where a hydrogen atom is substituted with hydroxy include a hydroxymethyl group, a 1-hydroxyethyl group, a 2-hydroxyethyl group, a 1-hydroxypropyl group, a 2-hydroxypropyl group, a 3-hydroxypropyl group, a 1-hydroxy-1-methylethyl group, a 2-hydroxy-1-methylethyl group, a 1-hydroxybutyl group, a 2-hydroxybutyl group, a 3-hydroxybutyl group and a 4-hydroxybutyl group.

$R^a$ and $R^b$ are each preferably a hydrogen atom, a methyl group, a hydroxymethyl group, a 1-hydroxyethyl group or a 2-hydroxyethyl group, more preferably a hydrogen atom or a methyl group.

Examples of the alkanediyl group constituting $R^c$ include a methylene group, an ethylene group, a propane-1,2-diyl group, a propane-1,3-diyl group, a butane-1,4-diyl group, a pentane-1,5-diyl group and a hexane-1,6-diyl group.

$X^1$ and $X^2$ are each preferably a single bond, a methylene group, an ethylene group, *—$CH_2$—O— (* represents a point to attachment to O) group or a *—$CH_2CH_2$—O-group, more preferably a single bond and a *—$CH_2CH_2$—O-group.

Specific examples of the compound represented by formula (I) include any compound represented by formula (I-1) to formula (I-15), preferably include any compound represented by formula (I-1), formula (I-3), formula (I-5), formula (I-7), formula (I-9), and formula (I-11) to formula (I-15), more preferably include any compound represented by formula (I-1), formula (I-7), formula (I-9), and formula (I-15).

[Formula 2]

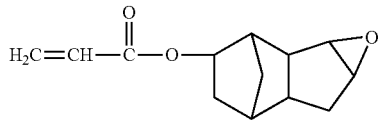
(I-1)

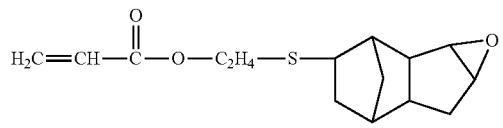
(I-2)

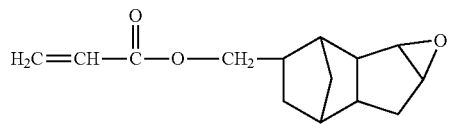
(I-3)

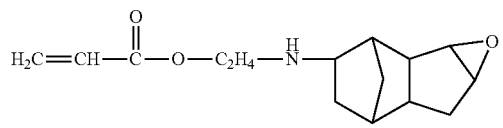
(I-4)

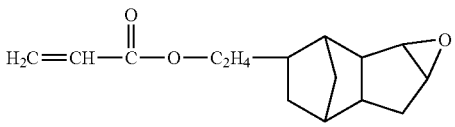
(I-5)

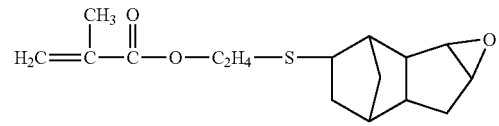
(I-6)

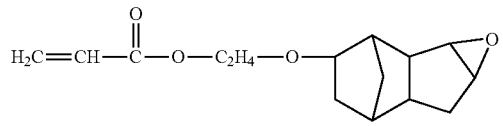
(I-7)

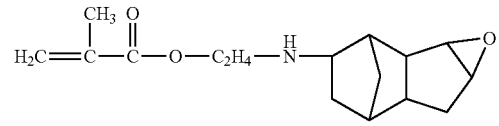
(I-8)

[Formula 3]

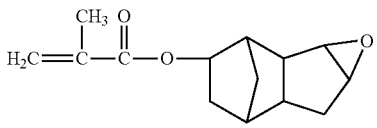
(I-9)

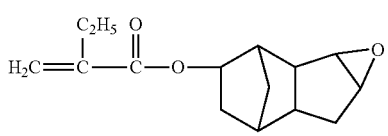
(I-10)

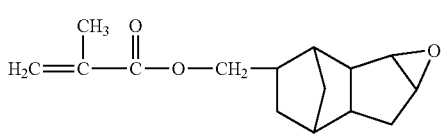
(I-11)

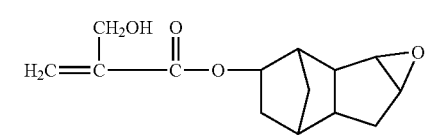
(I-12)

Specific examples of the compound represented by formula (II) include any compound represented by formula (II-1) to formula (II-15), preferably include any compound represented by formula (II-1), formula (II-3), formula (II-5), formula (II-7), formula (II-9), and formula (II-11) to formula (II-15), more preferably include any compound represented by formula (II-1), formula (II-7), formula (II-9), and formula (II-15).

The compound represented by formula (I) and the compound represented by formula (II) can be each used singly. Such compounds can be mixed at any ratio. In a case where such compounds are mixed, the mixing ratio thereof, as formula (I):formula (II) [molar ratio], is preferably 5:95 to 95:5, more preferably 10:90 to 90:10, further preferably 20:80 to 80:20.

The monomer (b2) having an oxetanyl group and an ethylenically unsaturated bond is preferably a monomer having an oxetanyl group and a (meth)acryloyloxy group.

Preferable examples of (b2) include 3-methyl-3-(meth)acryloyloxymethyloxetane, 3-ethyl-3-(meth)acryloyloxymethyloxetane, 3-methyl-3-(meth)acryloyloxyethyloxetane and 3-ethyl-3-(meth)acryloyloxyethyloxetane.

The monomer (b3) having a tetrahydrofuryl group and an ethylenically unsaturated bond is preferably a monomer having a tetrahydrofuryl group and a (meth)acryloyloxy group.

Preferable examples of (b3) include tetrahydrofurfuryl acrylate (for example, Viscoat V #150, manufactured by Osaka Organic Chemical Industry Ltd.) and tetrahydrofurfuryl methacrylate.

Specific examples of (c) include (meth)acrylic acid esters such as methyl (meth)acrylate, ethyl (meth)acrylate, n-butyl (meth)acrylate, sec-butyl (meth) acrylate, tert-butyl (meth) acrylate, 2-ethylhexyl (meth)acrylate, dodecyl (meth)acrylate, lauryl (meth) acrylate, stearyl (meth) acrylate, cyclopentyl (meth)acrylate, cyclohexyl (meth)acrylate, 2-methylcyclohexyl (meth) acrylate, tricyclo[5.2.1.0$^{2,6}$]decan-8-yl (meth)acrylate [called "dicyclopentanyl (meth)acrylate" as a trivial name in the art, alternatively, sometimes called "tricyclodecyl (meth)acrylate".], tricyclo[5.2.1.0$^{2,6}$]decen-8-yl (meth)acrylate [called "dicyclopentenyl (meth)acrylate" as a trivial name in the art.], dicyclopentanyloxyethyl (meth) acrylate, isobornyl (meth) acrylate, adamantyl (meth)acrylate, allyl (meth)acrylate, propargyl (meth)acrylate, phenyl (meth)acrylate, naphthyl (meth)acrylate and benzyl (meth) acrylate;

hydroxy group-containing (meth)acrylic acid esters such as 2-hydroxyethyl (meth)acrylate and 2-hydroxypropyl (meth)acrylate;

dicarboxylic acid diesters such as diethyl maleate, diethyl fumarate and diethyl itaconate;

bicyclo unsaturated compounds such as bicyclo[2.2.1] hept-2-ene, 5-methylbicyclo[2.2.1]hept-2-ene, 5-ethylbicyclo[2.2.1]hept-2-ene, 5-hydroxybicyclo[2.2.1]hept-2-ene, 5-hydroxymethylbicyclo[2.2.1]hept-2-ene, 5-(2'-hydroxyethyl)bicyclo[2.2.1]hept-2-ene, 5-methoxybicyclo[2.2.1] hept-2-ene, 5-ethoxybicyclo[2.2.1]hept-2-ene, 5,6-dihydroxybicyclo[2.2.1]hept-2-ene, 5,6-di(hydroxymethyl) bicyclo[2.2.1]hept-2-ene, 5,6-di(2'-hydroxyethyl)bicyclo [2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo[2.2.1]hept-2-ene, 5-hydroxy-5-ethylbicyclo[2.2.1] hept-2-ene, 5-hydroxymethyl-5-methylbicyclo[2.2.1]hept-2-ene, 5-tert-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-bis(tert-butoxycarbonyl)bicyclo[2.2.1]hept-2-ene and 5,6-bis(cyclohexyloxycarbonyl)bicyclo[2.2.1]hept-2-ene;

dicarbonylimide derivatives such as N-phenylmaleimide, N-cyclohexylmaleimide, N-benzylmaleimide, N-succinimidyl-3-maleimide benzoate, N-succinimidyl-4-maleimide butylate, N-succinimidyl-6-maleimide caproate, N-succinimidyl-3-maleimide propionate and N-(9-acrydinyl)maleimide; and styrene, α-methylstyrene, m-methylstyrene, p-methylstyrene, vinyltoluene, p-methoxystyrene, acrylonitrile, methacrylonitrile, vinyl chloride, vinylidene chloride, acrylamide, methacrylamide, vinyl acetate, 1,3-butadiene, isoprene, and 2,3-dimethyl-1,3-butadiene.

Among them, (c) is preferably benzyl (meth)acrylate, tricyclodecyl (meth) acrylate, styrene, N-phenylmaleimide, N-cyclohexylmaleimide, N-benzylmaleimide or bicyclo [2.2.1]hept-2-ene from the viewpoints of copolymerization reactivity and heat resistance, and (c) is more preferably benzyl (meth)acrylate or tricyclodecyl (meth)acrylate because developability in pattern formation is excellent.

The ratio of the structural unit derived from each in the resin [K1] preferably falls within the following range in the entire structural units constituting the resin [K1].

Structural unit derived from (a); 2 to 50% by mol (more preferably 10 to 45% by mol), and Structural unit derived from (b), in particular, structural unit derived from (b1); 50 to 98% by mol (more preferably 55 to 90% by mol).

In a case where the ratio of the structural units in the resin [K1] falls within the range, storage stability, developability, and solvent resistance of a pattern obtained tend to be excellent.

The resin [K1] can be produced with reference to the method described in the Literature "Kobunshi-Gosei no Jikkenho (Experimental Method for Polymer Synthesis)" (written by Takayuki Otsu, published by Kagakudojin, First Published, Vol. 1, issued on Mar. 1, 1972), and Cited Literatures described in the Literature.

Specific examples include a method including loading predetermined amounts of (a) and (b) (in particular, (b1)), and a polymerization initiator, a solvent and the like into a reaction vessel, and stirring, heating and warming the resultant under a deoxidization atmosphere. The polymerization initiator, the solvent and the like here used are not particularly limited, and any initiator and solvent commonly used in the art can be used. Examples of the polymerization initiator include azo compounds (2,2'-azobisisobutyronitrile, 2,2'-azobis(2,4-dimethylvaleronitrile) and the like), and organic peroxides (benzoyl peroxide and the like). The solvent may be any solvent which can dissolve each of the monomers, and, for example, a solvent (E) described below as the solvent of the blue curable resin composition can be used.

The resulting copolymer may be used in the form of a solution after the reaction, as it is, may be used in the form of a solution concentrated or diluted, or may be used in the form of a solid (powder) taken out according to a method such as reprecipitation. In particular, the solution after the reaction can be used as it is, by use of a solvent (E) described below, as the solvent in the polymerization, and thus a production process can be simplified.

The ratio of the structural unit derived from each in the resin [K2] preferably falls within the following range in the entire structural units constituting resin [K2].

Structural unit derived from (a); 4 to 45% by mol (more preferably 10 to 30% by mol), Structural unit derived from (b), in particular, structural unit derived from (b1); 2 to 95% by mol (more preferably 5 to 80% by mol), and Structural unit derived from (c); 1 to 65% by mol (more preferably 5 to 60% by mol).

In a case where the ratio of the structural units in the resin [K2] falls within the range, storage stability, developability, solvent resistance of a pattern obtained, heat resistance and mechanical strength tend to be excellent.

The resin [K2] can be produced in the same manner as in the method for producing the resin [K1]. Specific examples include a method including loading predetermined amounts of (a), (b) (in particular, (b1)) and (c), and a polymerization initiator and a solvent into a reaction vessel, and stirring, heating and warming the resultant under a deoxidization atmosphere. The resulting copolymer may be used in the form of a solution after the reaction, as it is, may be used in the form of a solution concentrated or diluted, or may be used in the form of a solid (powder) taken out according to a method such as reprecipitation.

The ratio of the structural unit derived from each in the resin [K3] preferably falls within the following range in the entire structural units constituting the resin [K3].

Structural unit derived from (a); 2 to 55% by mol (more preferably 10 to 50% by mol), and Structural unit derived from (c); 45 to 98% by mol (more preferably 50 to 90% by mol).

The resin [K3] can be produced in the same manner as in the method for producing the resin [K1].

The resin [K4] can be produced by obtaining a copolymer of (a) and (c), and adding a cyclic ether structure having 2 to 4 carbon atoms contained in (b), in particular, an oxirane ring contained in (b1), to carboxylic acid and/or carboxylic anhydride contained in (a). Specifically, a copolymer of (a) and (c) is first produced in the same manner as in the method for producing the resin [K1]. In such a case, the ratio of the structural unit derived from each preferably falls within the following range in the entire structural units constituting the copolymer of (a) and (c).

Structural unit derived from (a); 5 to 50% by mol (more preferably 10 to 45% by mol), and Structural unit derived from (c); 50 to 95% by mol (more preferably 55 to 90% by mol).

Next, the cyclic ether structure having 2 to 4 carbon atoms contained in (b), in particular, the oxirane ring contained in (b1) is allowed to further react with a part of a carboxylic acid and/or a carboxylic anhydride derived from (a) in the copolymer. Specifically, the nitrogen in the atmosphere in a flask is replaced with the air subsequent to production of the copolymer of (a) and (c), and (b) (in particular, (b1)), a reaction catalyst of carboxylic acid or carboxylic anhydride with a cyclic ether structure (for example, tris(dimethylaminomethyl)phenol), a polymerization inhibitor (for example, hydroquinone), and the like can be loaded into the flask and allowed to react at 60 to 130° C. for 1 to 10 hours, thereby providing the resin [K4].

The amount of (b) used, in particular, the amount of (b1) used is preferably 5 to 80 mol, more preferably 10 to 75 mol based on 100 mol of (a). In a case where the amount falls within the range, storage stability, developability, solvent resistance, heat resistance, mechanical strength and sensitivity tend to be well balanced. Since reactivity of the cyclic ether structure is high and the unreacted (b) hardly remains, (b) for use in the resin [K4] is preferably (b1), more preferably (b1-1).

The amount of the reaction catalyst used is preferably 0.001 to 5% by mass based on the total amount of (a), (b) (in particular, (b1)) and (c). The amount of the polymerization inhibitor used is preferably 0.001 to 5% by mass based on the total amount of (a), (b) and (c).

The reaction conditions, for example, the loading method, and the reaction temperature and time, can be appropriately adjusted in consideration of production facilities, the amount of heat generated due to polymerization, and the like. The loading method and the reaction temperature can be appropriately adjusted in consideration of production facilities, the amount of heat generated due to polymerization, and the like, as in the polymerization conditions.

In a case where a resin [K5] is produced, a copolymer of (b) (in particular, (b1)) and (c) is obtained at the first stage, in the same manner as in the above method for producing the resin [K1]. The resulting copolymer may be used in the form of a solution after the reaction, as it is, may be used in the form of a solution concentrated or diluted, or may be used in the form of a solid (powder) taken out according to a method such as reprecipitation, as in the above description.

The ratio between the respective structural units derived from (b) (in particular, (b1)) and (c) preferably falls within the following range based on the total molar number of the entire structural units constituting the copolymer.

Structural unit derived from (b), in particular, structural unit derived from (b1); 5 to 95% by mol (more preferably 10 to 90% by mol), and Structural unit derived from (c); 5 to 95% by mol (more preferably 10 to 90% by mol).

The resin [K5] can be obtained by allowing carboxylic acid or carboxylic anhydride contained in (a) to further react with a cyclic ether structure derived from (b) contained in the copolymer of (b) (in particular, (b1)) and (c) in the same conditions as those in the method for producing the resin [K4]. The amount of (a) used to react with the copolymer is preferably 5 to 80 mol based on 100 mol of (b) (in particular, (b1)). Since reactivity of the cyclic ether structure is high and the unreacted (b) hardly remains, (b) for use in the resin [K5] is preferably (b1), more preferably (b1-1).

The resin [K6] is a resin obtained by allowing the resin [K5] to further react with carboxylic anhydride.

A hydroxy group generated by a reaction of a cyclic ether structure and carboxylic acid or carboxylic anhydride is allowed to react with carboxylic anhydride.

Examples of the carboxylic anhydride include maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride and 5,6-dicarboxybicyclo[2.2.1]hept-2-ene anhydride (himic anhydride).

A preferable resin as the resin (B), among the resins [K1] to [K6], is [K1] or [K2]. The resin (B) may include one resin, or two or more resins.

The weight average molecular weight (Mw) in terms of polystyrene, of the resin (B), is preferably 3,000 to 100,000, more preferably 5,000 to 50,000, further preferably 5,000 to 30,000, still more preferably 8,000 to 15,000. In a case where the weight average molecular weight (Mw) falls within the range, not only the solubility of an unexposed region in a developer, but also the film remaining rate and the hardness of a pattern obtained tend to be high. The molecular weight distribution [weight average molecular weight (Mw)/number average molecular weight (Mn)] of the resin (B) is preferably 1.1 to 6, more preferably 1.2 to 4.

The acid value in terms of solid content of the resin (B) is preferably 5 to 200 mg-KOH/g, more preferably 50 to 180 mg-KOH/g, further preferably 80 to 150 mg-KOH/g, still more preferably 90 to 130 mg-KOH/g. The acid value is a value obtained by measuring the amount (mg) of potassium hydroxide necessary for neutralization of 1 g of a resin, and can be determined by titration with, for example, an aqueous potassium hydroxide solution.

The content of the resin (B) in 100% by mass of the solid content of the blue curable resin composition is preferably 5 to 50% by mass, more preferably 10 to 45% by mass, further preferably 15 to 40% by mass. In a case where the content of the resin (B) falls within the range, the solubility of an unexposed region in a developer tends to be high.

[3] Polymerizable Compound (C)

The polymerizable compound (C) is not particularly limited as long as the compound is a compound which can be polymerized by an active radical or the like generated from a polymerization initiator (D) due to light irradiation or the like, and examples thereof include a compound having a polymerizable ethylenically unsaturated bond. The weight average molecular weight of the polymerizable compound (C) is preferably 3,000 or less.

In particular, the polymerizable compound (C) is preferably a photo-polymerizable compound having three or more ethylenically unsaturated bonds, and examples thereof include trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta(meth)acrylate, tetrapentaerythritol deca(meth)acrylate, tetrapentaerythritol nona(meth)acrylate, tris(2-(meth)acryloyloxyethyl)isocyanurate, ethylene glycol-modified pentaerythritol tetra(meth)acrylate, ethylene glycol-modified dipentaerythritol hexa(meth)acrylate, propylene glycol-modified pentaerythritol tetra(meth)acrylate, propylene glycol-modified dipentaerythritol hexa(meth)acrylate, caprolactone-modified pentaerythritol tetra(meth)acrylate and caprolactone-modified dipentaerythritol hexa(meth)acrylate. Among them, dipentaerythritol penta(meth)acrylate and dipentaerythritol hexa(meth)acrylate are preferable.

The blue curable resin composition of the present invention can contain one or more polymerizable compounds (C). The content of the polymerizable compound(s) (C) is preferably 20 to 150 parts by mass, more preferably 50 to 120 parts by mass based on 100 parts by mass of the resin (B) in the blue curable resin composition.

[4] Polymerization Initiator (D)

The polymerization initiator (D) is not particularly limited as long as the initiator is a compound which can generate an active radical, an acid or the like by the action of light or heat to thereby initiate polymerization, and a known polymerization initiator can be used.

Examples of the polymerization initiator (D) include an oxime-based compound such as an O-acyloxime compound, an alkylphenone compound, a biimidazole compound, a triazine compound, and an acylphosphine oxide compound.

Such polymerization initiators (D) may be used in combinations of two or more thereof in consideration of sensitivity, and formability of a precise pattern shape, and the like. The polymerization initiator (D) preferably includes an oxime-based compound such as an O-acyloxime compound because there is an advantage in terms of precise manufacturing of a pattern shape having sensitivity and a desired line width.

The O-acyloxime compound is a compound having a structure represented by formula (d). Hereinafter, * represents a point to attachment.

[Formula 6]

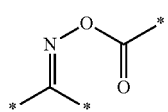
(d)

The O-acyloxime compound is preferably at least one selected from the group consisting of a compound represented by formula (d1) (hereinafter, sometimes referred to as "compound (d1)"), a compound represented by formula (d2) (hereinafter, sometimes referred to as "compound (d2)") and a compound represented by formula (d3) (hereinafter, sometimes referred to as "compound (d3)").

[Formula 7]

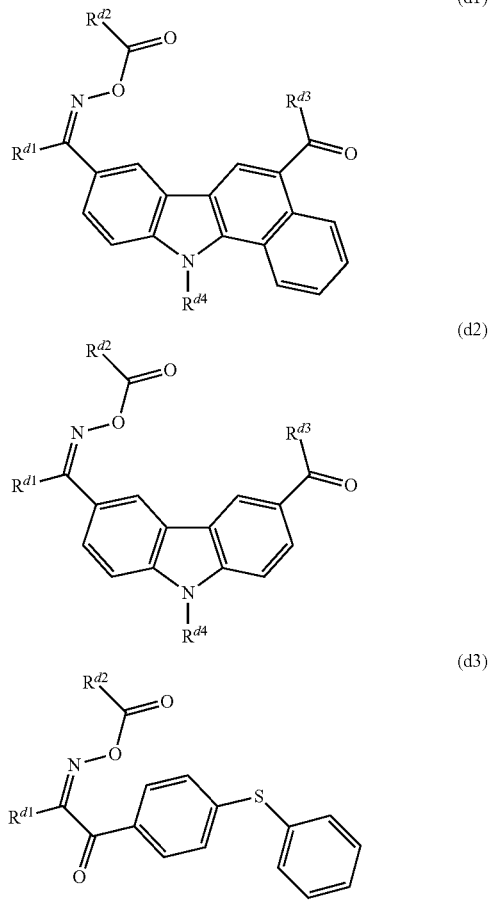

In formulae (d1) to (d3), $R^{d1}$ represents an aromatic hydrocarbon group having 6 to 18 carbon atoms and optionally having a substituent, a heterocyclic group having 3 to 36 carbon atoms and optionally having a substituent, an alkyl group having 1 to 15 carbon atoms and optionally having a substituent, or a group optionally having a substituent, where an aromatic hydrocarbon group and an alkanediyl group derived from the alkyl group are combined, and a methylene group (—$CH_2$—) contained in the alkyl group is optionally replaced with —O—, —CO—, —S—, —$SO_2$— or —$NR^{d5}$—;

$R^{d2}$ represents an aromatic hydrocarbon group having 6 to 18 carbon atoms, a heterocyclic group having 3 to 36 carbon atoms or an alkyl group having 1 to 10 carbon atoms;

$R^{d3}$ represents an aromatic hydrocarbon group having 6 to 18 carbon atoms and optionally having a substituent or a heterocyclic group having 3 to 36 carbon atoms and optionally having a substituent;

$R^{d4}$ represents an aromatic hydrocarbon group having 6 to 18 carbon atoms and optionally having a substituent or an aliphatic hydrocarbon group having 1 to 15 carbon atoms and optionally having a substituent, a methylene group (—$CH_2$—) contained in the aliphatic hydrocarbon group is optionally replaced with —O—, —CO— or —S—, a methine group (—CH<) contained in the aliphatic hydrocarbon group is optionally replaced with —$PO_3$<, and a hydrogen atom contained in the aliphatic hydrocarbon group is optionally substituted with an OH group; and $R^{d5}$ represents an alkyl group having 1 to 10 carbon atoms, and a methylene group (—CH$_2$—) contained in the alkyl group is optionally replaced with —O— or —CO—.

The number of carbon atoms of the aromatic hydrocarbon group represented by $R^{d1}$ is preferably 6 to 15, more preferably 6 to 12, further preferably 6 to 10. Examples of the aromatic hydrocarbon group include a phenyl group, a naphthyl group, an anthryl group, a phenanthryl group, a biphenyl group and a terphenyl group, preferably include a phenyl group and a naphthyl group, more preferably include a phenyl group.

The aromatic hydrocarbon group represented by $R^{d1}$ optionally has one or more substituents. Such a substituent is preferably located at the α-position or the γ-position of the aromatic hydrocarbon group, more preferably located at the γ-position.

Examples of such a substituent include alkyl groups having 1 to 15 carbon atoms, such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group and a pentadecyl group; and halogen atoms such as a fluorine atom, a chlorine atom, an iodine atom and a bromine atom.

The number of carbon atoms of the alkyl group as the substituent is preferably 1 to 10, more preferably 1 to 7. The alkyl group as the substituent may be any of straight, branched and cyclic or may be a combined group of a linear group and a cyclic group. A methylene group (—CH$_2$—) contained in the alkyl group as the substituent is optionally replaced with —O— or —S—. A hydrogen atom contained in the alkyl group is optionally substituted with a halogen atom such as a fluorine atom, a chlorine atom, an iodine atom or a bromine atom, and is preferably substituted with a fluorine atom.

Examples of the alkyl group as the substituent in the aromatic hydrocarbon group represented by $R^{d1}$ include any group represented by the following formulae. In the formulae, * represents a point to attachment.

[Formula 8]

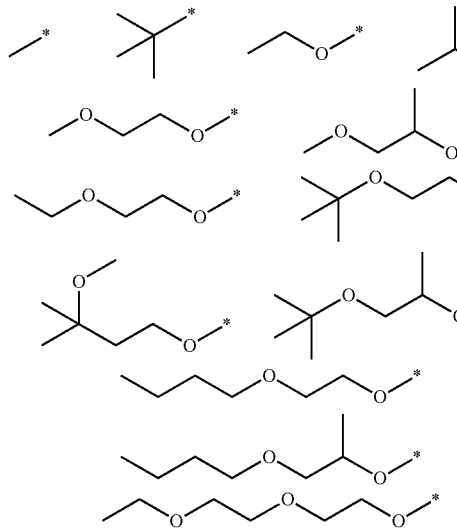

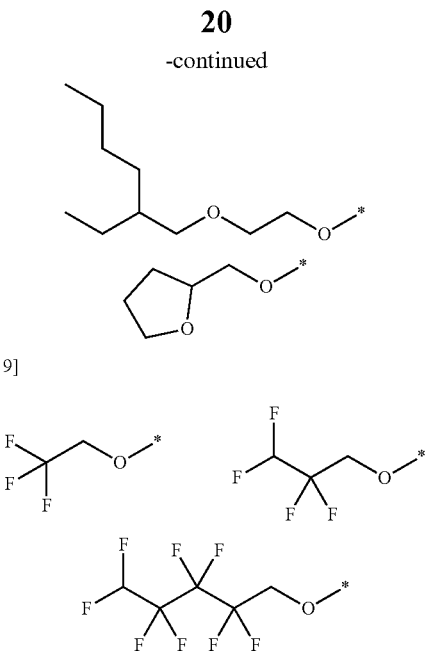

[Formula 9]

Examples of the aromatic hydrocarbon group represented by $R^{d1}$, optionally having a substituent, include any group represented by the following formulae. In the formulae, * represents a point to attachment.

[Formula 10]

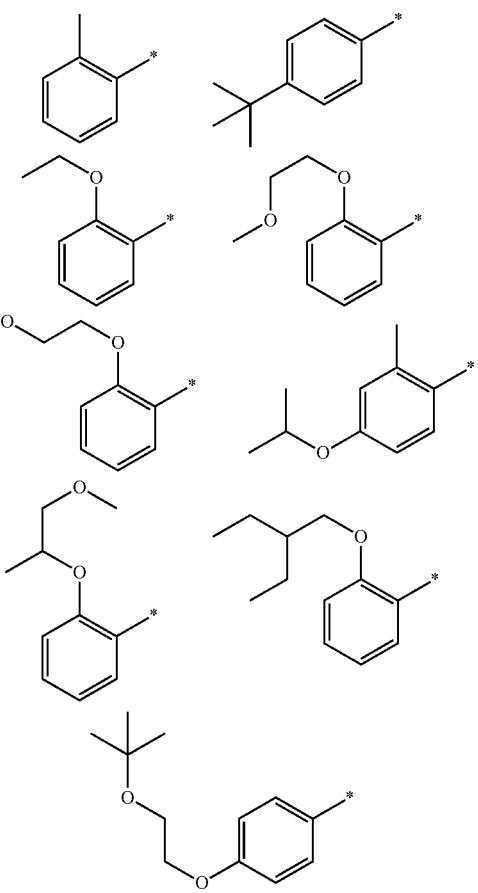

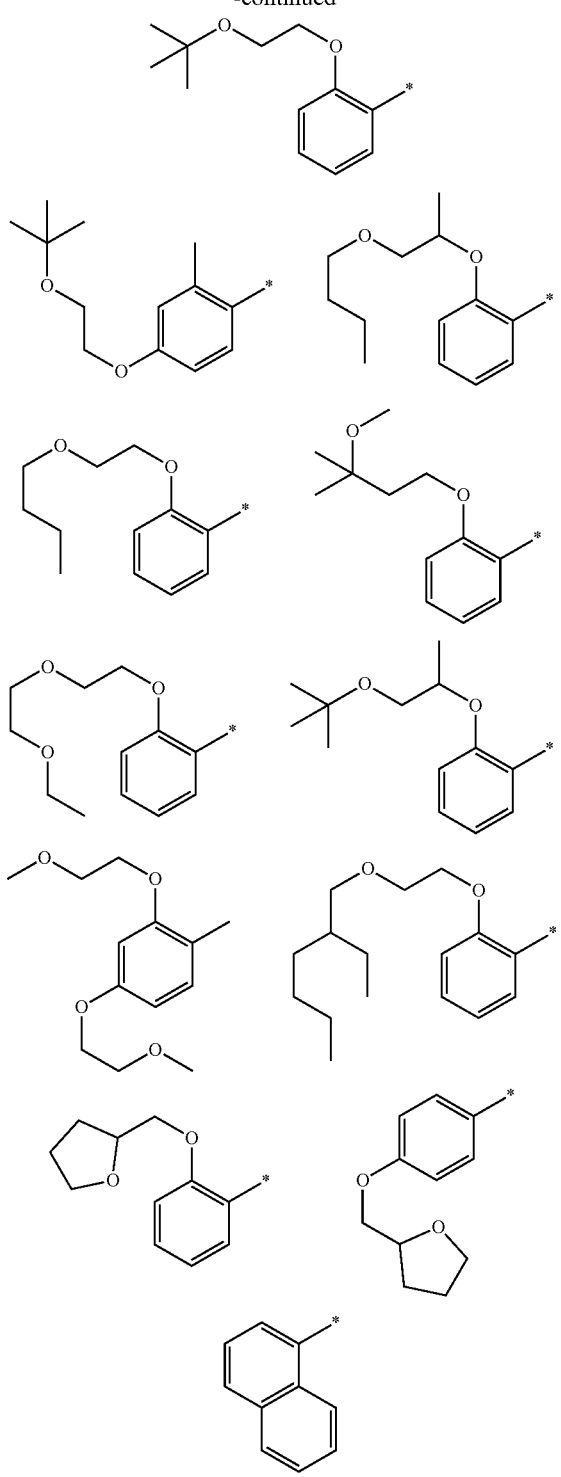

[Formula 11]

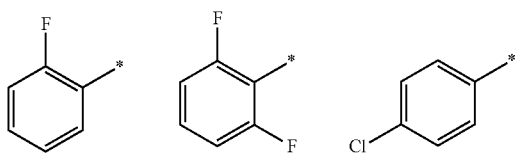

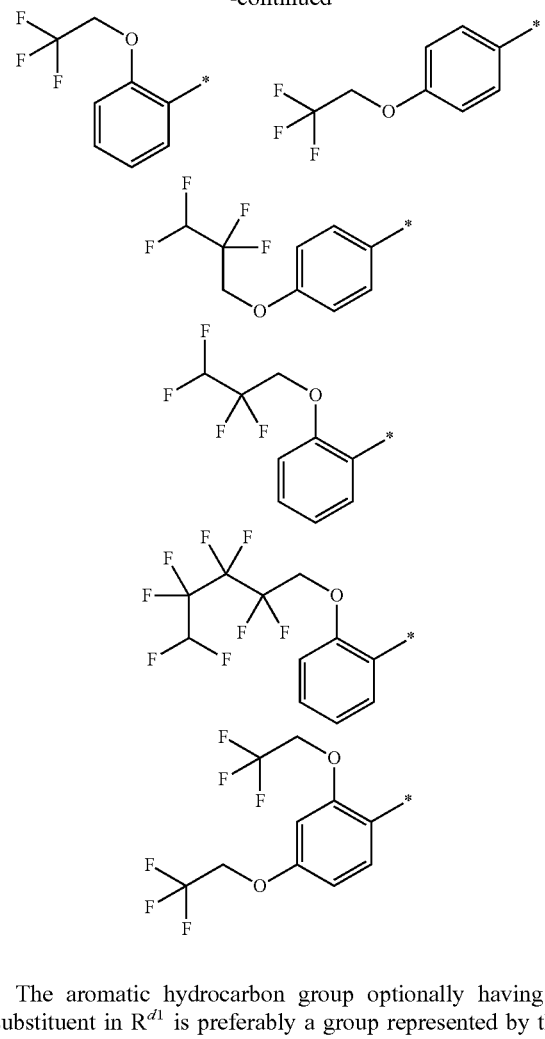

The aromatic hydrocarbon group optionally having a substituent in $R^{d1}$ is preferably a group represented by the following formula.

[Formula 12]

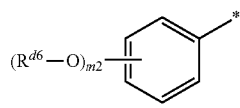

In the formula, $R^{d6}$ represents an alkyl group having 1 to 10 carbon atoms, optionally substituted with a halogen atom, and a hydrogen atom contained in $R^{d6}$ is optionally substituted with a halogen atom; m2 represents an integer of 1 to 5; and * represents a point to attachment.

Examples of the alkyl group represented by $R^{d6}$ include the same groups as the alkyl groups exemplified as the substituent(s) of the aromatic hydrocarbon group represented by $R^{d1}$. The number of carbon atoms of $R^{d6}$ is preferably 2 to 7, more preferably 2 to 5. The alkyl group represented by $R^{d6}$ may be any of straight, branched and cyclic, and is preferably linear.

Examples of a halogen atom with which a hydrogen atom contained in $R^{d6}$ is optionally substituted include a fluorine atom, a chlorine atom, an iodine atom and a bromine atom, particularly preferably a fluorine atom. Two or more and 10 or less hydrogen atoms contained in $R^{d6}$ are each preferably substituted with a halogen atom, 3 or more and 6 or less of such hydrogen atoms are each more preferably substituted with a halogen atom. The substitution position of an $R^{d6}O-$ group is preferably the ortho-position or para-position, particularly preferably the para-position. m2 is preferably 1 to 2, particularly preferably 1.

The number of carbon atoms of the heterocyclic group represented by $R^{d1}$ is preferably 3 to 20, more preferably 3 to 10, further preferably 3 to 5. Examples of the heterocyclic group include a pyrrolyl group, a furyl group, a thienyl group, an indolyl group, a benzofuryl group and a carbazolyl group.

The heterocyclic group represented by $R^{d1}$ optionally has one or more substituents. Examples of such a substituent include the same groups exemplified as the substituent(s) optionally contained in the aromatic hydrocarbon group represented by $R^{d1}$.

The number of carbon atoms of the alkyl group represented by $R^{d1}$ is preferably 1 to 12. Examples of the alkyl group represented by $R^{d1}$ include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group and a pentadecyl group. Such an alkyl group may be any of straight, branched and cyclic or may be a combined group of a linear group and a cyclic group. In the alkyl group represented by $R^{d1}$, a methylene group ($-CH_2-$) are optionally replaced with $-O-$, $-CO-$, $-S-$, $-SO_2-$ or $-NR^{d5}-$ and a hydrogen atom are optionally substituted with an OH group or an SH group.

$R^{d5}$ represents an alkyl group having 1 to 10 carbon atoms, preferably an alkyl group having 1 to 5 carbon atoms, more preferably an alkyl group having 1 to 3 carbon atoms. The alkyl group may be linear (straight or branched) or cyclic, may be any of straight, branched and cyclic, or may be a combined group of a linear group and a cyclic group. A methylene group ($-CH_2-$) in the alkyl group of $R^{d5}$ is optionally replaced with $-O-$ or $-CO-$.

Specific examples of the alkyl group optionally having a substituent in $R^{d1}$ include any group represented by the following formula. * represents a point to attachment.

[Formula 13]

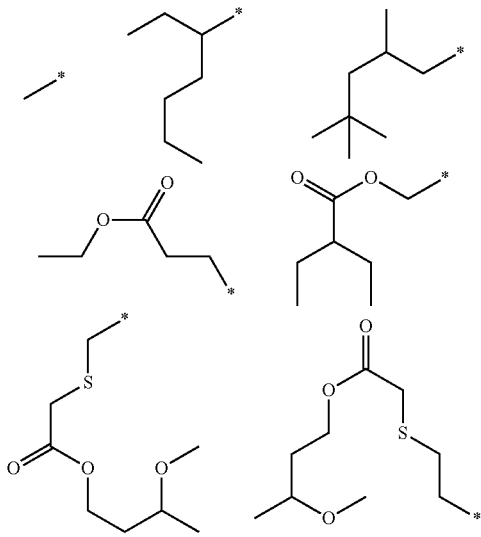

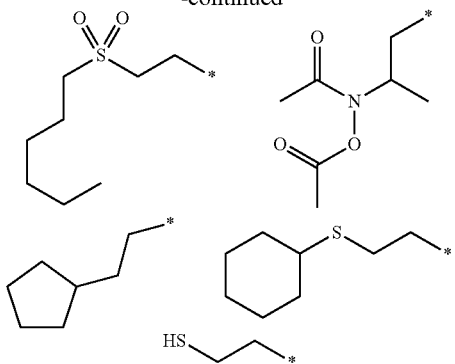

The number of carbon atoms of the combined group of an aromatic hydrocarbon group and an alkanediyl group, in $R^{d1}$, is preferably 7 to 33, more preferably 7 to 18, further preferably 7 to 12. The combined group optionally has one or more substituents, and examples of such a substituent include the same groups exemplified as the substituent(s) optionally contained in the aromatic hydrocarbon group and the alkyl group. Examples of the combined group of an aromatic hydrocarbon group and an alkanediyl group, represented as $R^{d1}$, include an aralkyl group, and specific examples thereof can include any group represented by the following formula. In the formula, * represents a point to attachment.

[Formula 14]

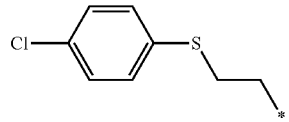

In particular, $R^{d1}$ preferably represents an aromatic hydrocarbon group optionally having a substituent or an alkyl group optionally having a substituent, more preferably an aromatic hydrocarbon group optionally having a substituent.

The number of carbon atoms of the aromatic hydrocarbon group represented by $R^{d2}$ is preferably 6 to 15, more preferably 6 to 12, further preferably 6 to 10. Examples of the aromatic hydrocarbon group include a phenyl group, a naphthyl group, an anthryl group, a phenanthryl group, a biphenyl group and a terphenyl group.

The number of carbon atoms of the heterocyclic group represented by $R^{d2}$ is preferably 3 to 20, more preferably 3 to 10, further preferably 3 to 5. Examples of the heterocyclic group include a pyrrolyl group, a furyl group, a thienyl group, an indolyl group, a benzofuryl group and a carbazolyl group.

The number of carbon atoms of the alkyl group represented by $R^{d2}$ is preferably 1 to 7, more preferably 1 to 5, further preferably 1 to 3. Examples of the alkyl group include a methyl group, an ethyl group, a propyl group, a butyl group, a pentyl group, a hexyl group, a heptyl group, an octyl group, a nonyl group and a decyl group. The alkyl group may be any of straight, branched and cyclic or may be a combined group of a linear group and a cyclic group.

$R^{d2}$ preferably represents a linear alkyl group, more preferably a linear alkyl group having 1 to 5 carbon atoms, further preferably a linear alkyl group having 1 to 3 carbon atoms, especially preferably a methyl group.

The number of carbon atoms of the aromatic hydrocarbon group represented by $R^{d3}$ is preferably 6 to 15, more preferably 6 to 12, further preferably 6 to 10. Examples of the aromatic hydrocarbon group include a phenyl group, a naphthyl group, an anthryl group, a phenanthryl group, a biphenyl group and a terphenyl group, preferably a phenyl group and a naphthyl group.

The aromatic hydrocarbon group represented by $R^{d3}$ optionally has one or more substituents. Such a substituent is preferably located at the α-position or the γ-position of the aromatic hydrocarbon group. Such a substituent is preferably an aliphatic hydrocarbon group having 1 to 15 carbon atoms, and specific examples thereof include alkyl groups having 1 to 15 carbon atoms, such as a methyl group, an ethyl group, a propyl group, a butyl group, a pentyl group, a hexyl group, a heptyl group, an octyl group, a nonyl group and a decyl group; and alkenyl groups having 1 to 15 carbon atoms, such as an ethenyl group, a propenyl group, a butenyl group, a pentenyl group, a hexenyl group, a heptenyl group, a nonenyl group and a decenyl group.

The aromatic hydrocarbon group represented by $R^{d3}$ optionally has an aliphatic hydrocarbon group. The number of carbon atoms of the aliphatic hydrocarbon group is preferably 1 to 7, and the aliphatic hydrocarbon group may be any of straight, branched and cyclic or may be a combined group of a linear group and a cyclic group. A methylene group (—$CH_2$—) and a methine group (—CH<) contained in the aliphatic hydrocarbon group are optionally replaced with —O—, —CO— or —S— and —N<, respectively.

Examples of the aliphatic hydrocarbon group include any group represented by the following formula. In the formula, * represents a point to attachment.

[Formula 15]

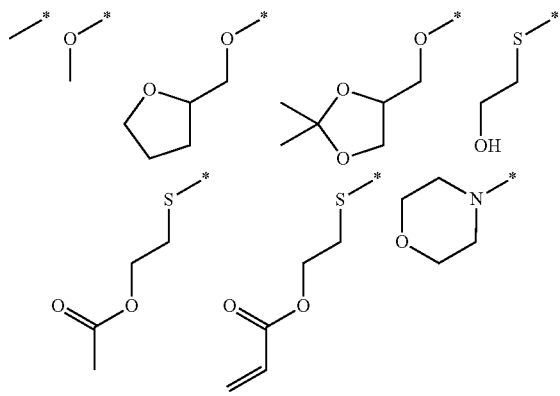

Examples of the aromatic hydrocarbon group optionally having a substituent in $R^{d3}$ include any group represented by the following formula. In the formula, * represents a point to attachment.

[Formula 16]

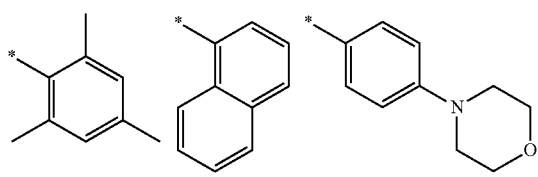

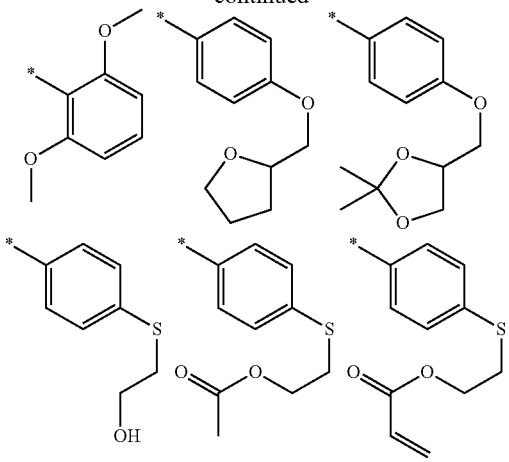

The number of carbon atoms of the heterocyclic group represented by $R^{d3}$ is preferably 3 to 20, more preferably 3 to 10, further preferably 3 to 5. Examples of the heterocyclic group include a pyrrolyl group, a furyl group, a thienyl group, an indolyl group, a benzofuryl group and a carbazolyl group. The heterocyclic group represented by $R^{d3}$ optionally has one or more substituents, and examples of such a substituent include the same groups exemplified as the substituent(s) optionally contained in the aromatic hydrocarbon group represented by $R^{d1}$.

Among them, $R^{d3}$ preferably represents an aromatic hydrocarbon group having a substituent, examples of such a substituent preferably include a linear alkyl group having 1 to 7 carbon atoms (more preferably 1 to 3 carbon atoms), and the number of such substituents is preferably 2 or more and 5 or less.

The number of carbon atoms of the aromatic hydrocarbon group represented by $R^{d4}$ is preferably 6 to 15, more preferably 6 to 12, further preferably 6 to 10. Examples of the aromatic hydrocarbon group include a phenyl group, a naphthyl group, an anthryl group, a phenanthryl group, a biphenyl group and a terphenyl group, more preferably a phenyl group and a naphthyl group, further preferably a phenyl group. The aromatic hydrocarbon group represented by $R^{d4}$ optionally has one or more substituents. Examples of such a substituent include the same groups as the substituents optionally contained in the aromatic hydrocarbon group of $R^{d1}$.

The number of carbon atoms of the aliphatic hydrocarbon group represented by $R^{d4}$ is preferably 1 to 13, more preferably 2 to 10, further preferably 4 to 9. Examples of the aliphatic hydrocarbon group represented by $R^{d4}$ include alkyl groups such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group and a pentadecyl group; and alkenyl groups such as an ethenyl group, a propenyl group, a butenyl group, a pentenyl group, a hexenyl group, a heptenyl group, an octenyl group, a nonenyl group, a decenyl group, an undecenyl group, a dodecenyl group, a tridecenyl group, a butadecenyl group and a pentadecenyl group. Such an aliphatic hydrocarbon group may be linear (straight or branched) or cyclic, or may be a combined group of a linear group and a cyclic group.

A methylene group (—$CH_2$—) and a methine group (—CH<) in the aliphatic hydrocarbon group of $R^{d4}$ are optionally replaced with —O—, —CO— or —S— and —PO₃<, respectively, and a hydrogen atom contained in the aliphatic hydrocarbon group is optionally substituted with an OH group.

Examples of the aliphatic hydrocarbon group represented by $R^{d4}$, optionally having a substituent, include any group represented by the following formula. In the formula, * represents a point to attachment.

[Formula 17]

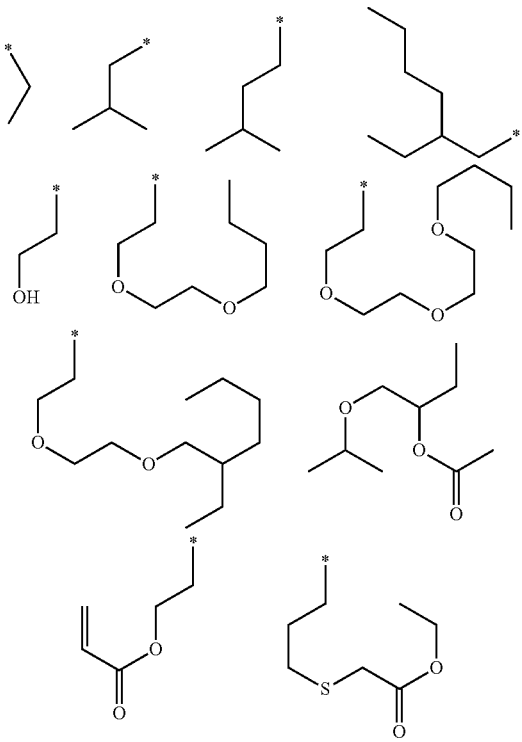

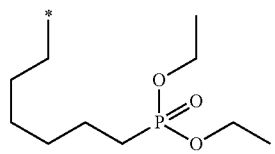

$R^{d4}$ preferably represents a linear aliphatic hydrocarbon group optionally having a substituent, more preferably a linear alkyl group having no substituent, further preferably a branched alkyl group having no substituent.

Examples of the compound (d1) include a compound represented by formula (d1), specifically include compounds (d1-1) to (d1-67) each having a substituent described in Table 1 to Table 7. In Tables 1 to 7, * represents a point to attachment.

[Formula 18]

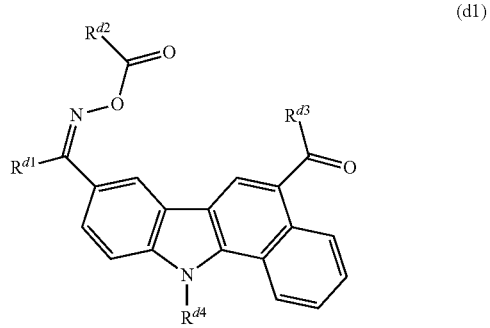

TABLE 1

| | $R^{d1}$ | $R^{d2}$ | $R^{d3}$ | $R^{d4}$ |
|---|---|---|---|---|
| (d1-1) | *—CH₃ | *—CH₃ | | |
| (d1-2) | | *—CH₃ | | |
| (d1-3) | | *—CH₃ | | |

TABLE 1-continued
| | $R^{d1}$ | $R^{d2}$ | $R^{d3}$ | $R^{d4}$ |
|---|---|---|---|---|
| (d1-4) | 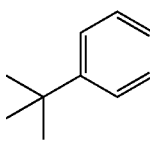 | *—CH$_3$ | 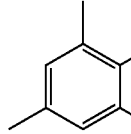 | 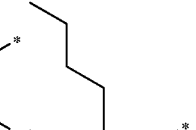 |
| (d1-5) | 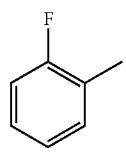 | *—CH$_3$ | 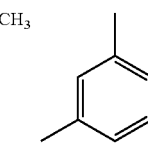 | 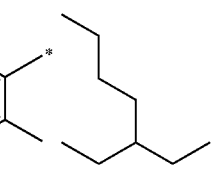 |
| (d1-6) | 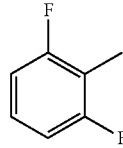 | *—CH$_3$ | 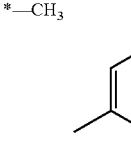 | 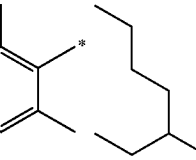 |
| (d1-7) | 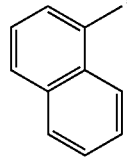 | *—CH$_3$ | 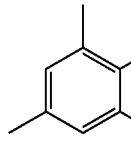 | 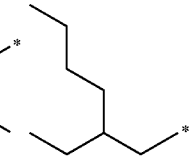 |
| (d1-8) | 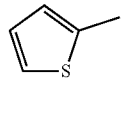 | *—CH$_3$ | 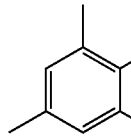 |  |
| (d1-9) | 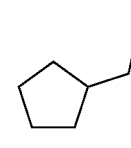 | *—CH$_3$ | 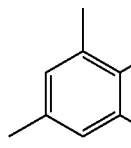 | 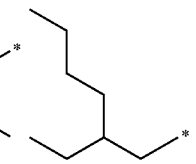 |
| (d1-10) | 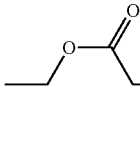 | *—CH$_3$ | 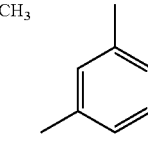 | 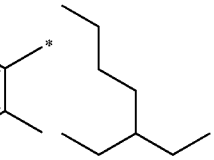 |
TABLE 2
| | $R^{d1}$ | $R^{d2}$ | $R^{d3}$ | $R^{d4}$ |
|---|---|---|---|---|
| (d1-11) | 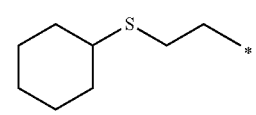 | *—CH$_3$ | 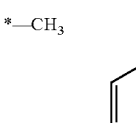 |  |

TABLE 2-continued

| | $R^{d1}$ | $R^{d2}$ | $R^{d3}$ | $R^{d4}$ |
|---|---|---|---|---|
| (d1-12) | | *—CH$_3$ | | |
| (d1-13) | | *—CH$_3$ | | |
| (d1-14) | | *—CH$_3$ | | |
| (d1-15) | | *—CH$_3$ | | |
| (d1-16) | | *—CH$_3$ | | |
| (d1-17) | | *—CH$_3$ | | |
| (d1-18) | | *—CH$_3$ | | |
| (d1-19) | | *—CH$_3$ | | |

TABLE 2-continued

| | $R^{d1}$ | $R^{d2}$ | $R^{d3}$ | $R^{d4}$ |
|---|---|---|---|---|
| (d1-20) | 2-(1-methoxypropan-2-yloxy)phenyl | *—CH₃ | 2,4,6-trimethylphenyl | 2-ethylhexyl |

TABLE 3

| | $R^{d1}$ | $R^{d2}$ | $R^{d3}$ | $R^{d4}$ |
|---|---|---|---|---|
| (d1-21) | 4-(2-tert-butoxyethoxy)-2-methylphenyl | *—CH₃ | 2,4,6-trimethylphenyl | 2-ethylhexyl |
| (d1-22) | 4-isopropoxy-2-methylphenyl | *—CH₃ | 2,4,6-trimethylphenyl | 2-ethylhexyl |
| (d1-23) | 4-(2-tert-butoxyethoxy)phenyl | *—CH₃ | 2,4,6-trimethylphenyl | 2-ethylhexyl |
| (d1-24) | 2-(2,2,3,3-tetrafluoropropoxy)phenyl | *—CH₃ | 2,4,6-trimethylphenyl | 2-ethylhexyl |
| (d1-25) | 2-(2-tert-butoxyethoxy)phenyl | *—CH₃ | 2,4,6-trimethylphenyl | 2-ethylhexyl |
| (d1-26) | 2-((tetrahydrofuran-2-yl)methoxy)phenyl | *—CH₃ | 2,4,6-trimethylphenyl | 2-ethylhexyl |

TABLE 3-continued
| | $R^{d1}$ | $R^{d2}$ | $R^{d3}$ | $R^{d4}$ |
|---|---|---|---|---|
| (d1-27) | 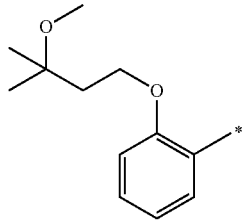 | *—CH$_3$ | 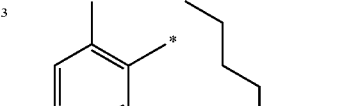 |  |
| (d1-28) | 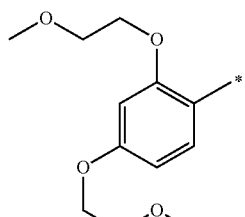 | *—CH$_3$ | 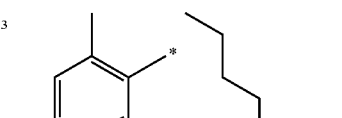 |  |
| (d1-29) | 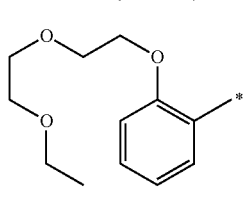 | *—CH$_3$ | 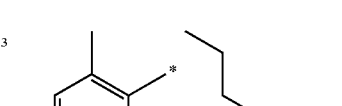 |  |
| (d1-30) | 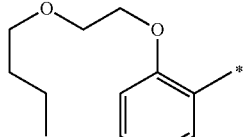 | *—CH$_3$ | 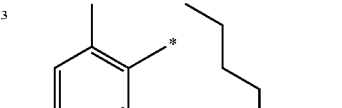 |  |
TABLE 4
| | $R^{d1}$ | $R^{d2}$ | $R^{d3}$ | $R^{d4}$ |
|---|---|---|---|---|
| (d1-31) | 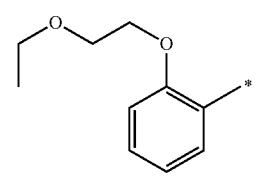 | *—CH$_3$ | 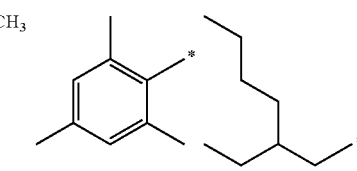 |  |
| (d1-32) | 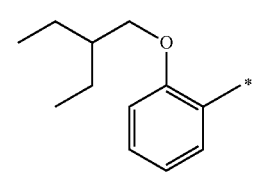 | *—CH$_3$ | 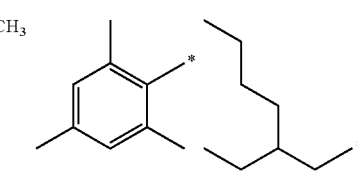 |  |
| (d1-33) | 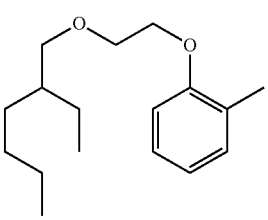 | *—CH$_3$ | 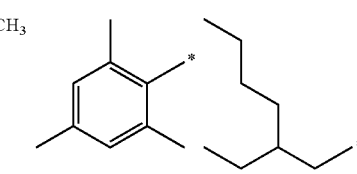 |  |

TABLE 4-continued

| | $R^{d1}$ | $R^{d2}$ | $R^{d3}$ | $R^{d4}$ |
|---|---|---|---|---|
| (d1-34) | [butoxypropoxy-phenyl] | *—CH₃ | [dimethylphenyl] | [2-ethylhexyl] |
| (d1-35) | [tert-butoxypropoxy-phenyl] | *—CH₃ | [dimethylphenyl] | [2-ethylhexyl] |
| (d1-36) | [2,2,2-trifluoroethoxy-phenyl] | *—CH₃ | [dimethylphenyl] | [2-ethylhexyl] |
| (d1-37) | [bis(2,2,2-trifluoroethoxy)-phenyl] | *—CH₃ | [dimethylphenyl] | [2-ethylhexyl] |
| (d1-38) | [perfluoropentyloxy-phenyl] | *—CH₃ | [dimethylphenyl] | [2-ethylhexyl] |
| (d1-39) | [4-(2,2,2-trifluoroethoxy)phenyl] | *—CH₃ | [dimethylphenyl] | [2-ethylhexyl] |
| (d1-40) | [4-(2,2,3,3-tetrafluoropropoxy)phenyl] | *—CH₃ | [dimethylphenyl] | [2-ethylhexyl] |

TABLE 5

| | $R^{d1}$ | $R^{d2}$ | $R^{d3}$ | $R^{d4}$ |
|---|---|---|---|---|
| (d1-41) | 4-((tetrahydrofuran-2-yl)methoxy)phenyl | *—CH$_3$ | 2,3,5-trimethylphenyl | 2-ethylhexyl |
| (d1-42) | 4-(2-(tert-butoxy)ethoxy)-2-methylphenyl | *—CH$_3$ | 2,3,5-trimethylphenyl | *—CH$_2$CH$_3$ |
| (d1-43) | 2-(2-methoxyethoxy)phenyl | *—CH$_3$ | 2,3,5-trimethylphenyl | isobutyl |
| (d1-44) | 2-(2-methoxyethoxy)phenyl | *—CH$_3$ | 2,3,5-trimethylphenyl | isopentyl |
| (d1-45) | 2-(2-butoxyethoxy)phenyl | *—CH$_3$ | 2,3,5-trimethylphenyl | isobutyl |
| (d1-46) | 2-(2-butoxyethoxy)phenyl | *—CH$_3$ | 2,3,5-trimethylphenyl | isopentyl |
| (d1-47) | 2-(2-(2-ethoxyethoxy)ethoxy)phenyl | *—CH$_3$ | 2,3,5-trimethylphenyl | isopentyl |
| (d1-48) | 2-(2-(2-ethoxyethoxy)ethoxy)phenyl | *—CH$_3$ | 2,3,5-trimethylphenyl | isobutyl |

TABLE 5-continued

| | $R^{d1}$ | $R^{d2}$ | $R^{d3}$ | $R^{d4}$ |
|---|---|---|---|---|
| (d1-49) | *o-tolyl* | *—CH$_3$ | 2,4,6-trimethylphenyl | *—CH$_2$CH$_2$—O—CH$_2$CH$_2$—O—CH$_2$CH$_2$CH$_3$ |
| (d1-50) | *o-tolyl* | *—CH$_3$ | 2,4,6-trimethylphenyl | *—CH$_2$CH$_2$—O—CH$_2$CH$_2$—O—CH$_2$CH$_2$CH$_2$CH$_3$ |

TABLE 6

| | $R^{d1}$ | $R^{d2}$ | $R^{d3}$ | $R^{d4}$ |
|---|---|---|---|---|
| (d1-51) | *o-tolyl* | *—CH$_3$ | 2,4,6-trimethylphenyl | *—CH$_2$CH$_2$—O—CH$_2$CH$_2$—O—CH$_2$—CH(C$_2$H$_5$)—C$_4$H$_9$ |
| (d1-52) | *o-tolyl* | *—CH$_3$ | 2,4,6-trimethylphenyl | *—CH$_2$CH$_2$CH$_2$—S—CH$_2$—C(=O)—O—C$_2$H$_5$ |
| (d1-53) | *2,4,4-trimethylpentyl* | *—CH$_3$ | 2,4,6-trimethylphenyl | *—(CH$_2$)$_5$—P(=O)(OC$_2$H$_5$)$_2$ |
| (d1-54) | *sec-hexyl* | *—CH$_3$ | 2,4,6-trimethylphenyl | *—CH$_2$—CH(O-iPr)—CH$_2$—O—C(=O)CH$_3$ ... |
| (d1-55) | *2-(2-methoxyethoxy)phenyl* | *—CH$_3$ | 2,4,6-trimethylphenyl | *—CH$_2$—CH(O-iPr)—CH$_2$—O—C(=O)CH$_3$ ... |

TABLE 6-continued
| | $R^{d1}$ | $R^{d2}$ | $R^{d3}$ | $R^{d4}$ |
|---|---|---|---|---|
| (d1-56) | 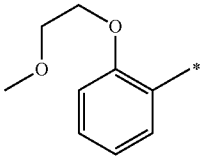 | *—CH$_3$ | 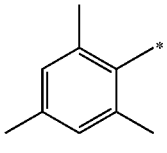 | 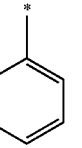 |
| (d1-57) | 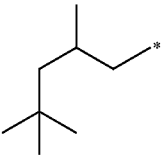 | *—CH$_3$ | 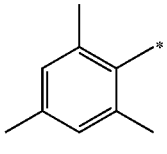 | 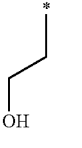 |
| (d1-58) | 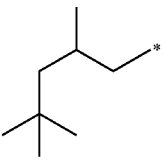 | *—CH$_3$ | 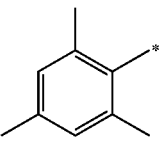 | 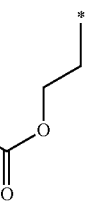 |
| (d1-59) | 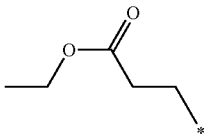 | *—CH$_3$ | 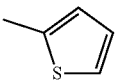 | 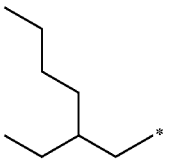 |
| (d1-60) | 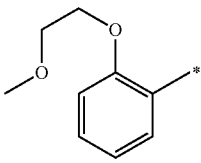 | *—CH$_3$ | 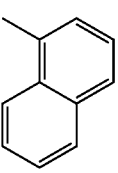 | 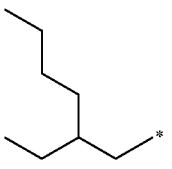 |
TABLE 7
| | $R^{d1}$ | $R^{d2}$ | $R^{d3}$ | $R^{d4}$ |
|---|---|---|---|---|
| (d1-61) | 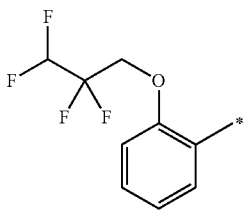 | *—CH$_3$ | 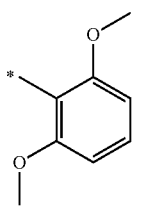 | 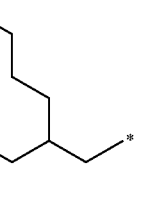 |
| (d1-62) | 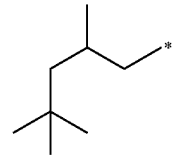 | *—CH$_3$ | 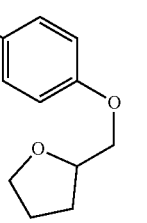 | 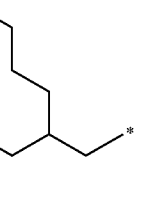 |

TABLE 7-continued

| | $R^{d1}$ | $R^{d2}$ | $R^{d3}$ | $R^{d4}$ |
|---|---|---|---|---|
| (d1-63) | | *—CH₃ | | |
| (d1-64) | | *—CH₃ | | |
| (d1-65) | | *—CH₃ | | |
| (d1-66) | | *—CH₃ | | |
| (d1-67) | | *—CH₃ | | |

Among them, the compounds represented by formula (d1-3) to formula (d1-6), the compounds represented by formula (d1-18) to formula (d1-52), the compound represented by formula (d1-55), the compound represented by formula (d1-56), the compound represented by formula (d1-60), and the compound represented by formula (d1-61) are preferable, the compounds represented by formula (d1-3) to formula (d1-6) and the compounds represented by formula (d1-18) to formula (d1-41) are more preferable, the compound represented by formula (d1-24) and the compounds represented by formula (d1-36) to formula (d1-40) are further preferable, and the compound represented by formula (d1-24) is especially preferable.

The compound (d1) can be produced by the production method described in, for example, Japanese Translation of PCT International Application Publication No. 2014-500852.

The compound (d2) is preferably a compound in which $R^{d1}$ represents an alkyl group having 1 to 15 carbon atoms and optionally having a substituent, $R^{d2}$ represents an alkyl group having 1 to 10 carbon atoms, $R^{d3}$ represents an aromatic hydrocarbon group having 6 to 18 carbon atoms and optionally having a substituent, and $R^{d4}$ represents an aliphatic hydrocarbon group having 1 to 15 carbon atoms and optionally having a substituent, more preferably a compound in which $R^{d1}$ represents a methyl group, an ethyl group or a propyl group, $R^{d2}$ represents a methyl group, an ethyl group or a propyl group, $R^{d3}$ represents a phenyl group substituted with a methyl group, and $R^{d4}$ represents a methyl group, an ethyl group or a propyl group, further preferably a compound in which R$^{d1}$ and R$^{d2}$ each represent a methyl group, R$^{d3}$ represents an o-tolyl group and R$^{d4}$ represents an ethyl group.

The compound (d3) is preferably a compound in which R$^{d1}$ represents an alkyl group having 1 to 15 carbon atoms and optionally having a substituent, and
R$^{d2}$ represents an aromatic hydrocarbon group having 6 to 18 carbon atoms,
more preferably a compound in which
R$^{d1}$ represents a hexyl group and R$^{d2}$ represents a phenyl group.

Examples of such an O-acyloxime compound include N-benzoyloxy-1-(4-phenylsulfanylphenyl)butan-1-on-2-imine, N-benzoyloxy-1-(4-phenylsulfanylphenyl)octan-1-on-2-imine, N-benzoyloxy-1-(4-phenylsulfanylphenyl)-3-cyclopentylpropan-1-on-2-imine, N-acetoxy-1-[9-ethyl-6-(2-methylbenzoyl)-9H-carbazol-3-yl]ethan-1-imine, N-acetoxy-1-[9-ethyl-6-{2-methyl-4-(3,3-dimethyl-2,4-dioxacyclopentanylmethyloxy)benzoyl}-9H-carbazol-3-yl]ethan-1-imine, N-acetoxy-1-[9-ethyl-6-(2-methylbenzoyl)-9H-carbazol-3-yl]-3-cyclopentylpropan-1-imine and N-benzoyloxy-1-[9-ethyl-6-(2-methylbenzoyl)-9H-carbazol-3-yl]-3-cyclopentylpropan-1-on-2-imine. Any of commercially available products such as Irgacure OXE01, OXE02 and OXE03 (all are manufactured by BASF SE), and N-1919 (manufactured by Adeka Corporation) may also be used. Such an O-acyloxime compound tends to allow a blue color filter excellent in photolithographic performance to be obtained.

The alkylphenone compound is a compound having a structure represented by formula (d4) or a structure represented by formula (d5). * represents a point to attachment. A benzene ring among such structures optionally has a substituent.

[Formula 19]

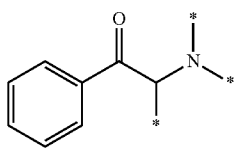

(d4)

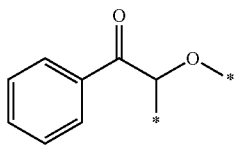

(d5)

Examples of the compound having a structure represented by formula (d4) include 2-methyl-2-morpholino-1-(4-methylsulfanylphenyl)propan-1-one, 2-dimethylamino-1-(4-morpholinophenyl)-2-benzylbutan-1-one and 2-(dimethylamino)-2-[(4-methylphenyl)methyl]-1-[4-(4-morpholinyl)phenyl]butan-1-one. Any of commercially available products such as Irgacure 369, 907 and 379 (all are manufactured by BASF SE) may also be used.

Examples of the compound having a structure represented by formula (d5) include 2-hydroxy-2-methyl-1-phenylpropan-1-one, 2-hydroxy-2-methyl-1-[4-(2-hydroxyethoxy)phenyl]propan-1-one, 1-hydroxycyclohexyl phenyl ketone, an oligomer of 2-hydroxy-2-methyl-1-(4-isopropenylphenyl)propan-1-one, α,α-diethoxyacetophenone and benzyl dimethyl ketal.

The alkylphenone compound is preferably the compound having a structure represented by formula (d4), in terms of sensitivity.

Examples of the biimidazole compound include 2,2'-bis(2-chlorophenyl)-4,4',5,5'-tetraphenylbiimidazole, 2,2'-bis(2,3-dichlorophenyl)-4,4',5,5'-tetraphenylbiimidazole (see, for example, Japanese Patent Laid-Open No. 6-75372 and Japanese Patent Laid-Open No. 6-75373), 2,2'-bis(2-chlorophenyl)-4,4',5,5'-tetraphenylbiimidazole, 2,2'-bis(2-chlorophenyl)-4,4',5,5'-tetra(alkoxyphenyl)biimidazole, 2,2'-bis(2-chlorophenyl)-4,4',5,5'-tetra(dialkoxyphenyl)biimidazole, 2,2'-bis(2-chlorophenyl)-4,4',5,5'-tetra(trialkoxyphenyl)biimidazole (see, for example, Japanese Patent Publication No. 48-38403 and Japanese Patent Laid-Open No. S62-174204), and an imidazole compound where phenyl groups at the 4,4',5,5'-positions are each substituted with a carboalkoxy group (see, for example, Japanese Patent Laid-Open No. 7-10913). In particular, a compound represented by the following formula or a mixture thereof is preferable.

[Formula 20]

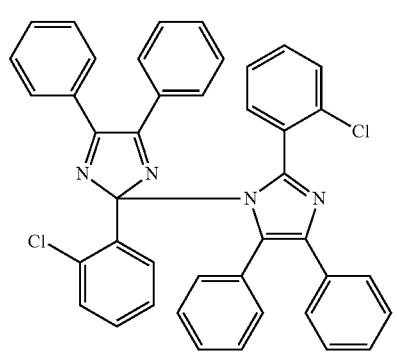

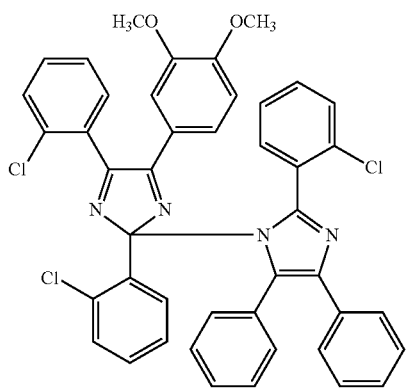

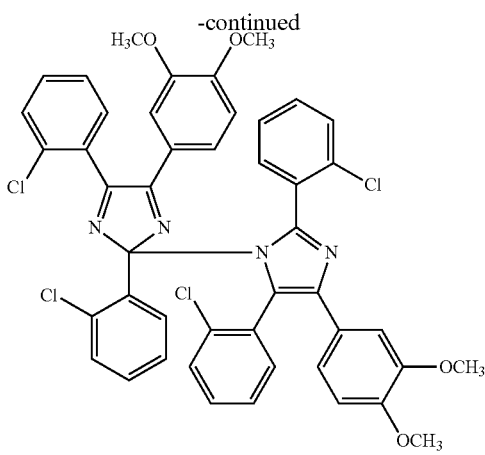

Examples of the triazine compound include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine and 2,4-bis(trichloromethyl)-6-[2-(3,4-dimethoxyphenyl)ethenyl]-1,3,5-triazine.

Examples of the acylphosphine oxide compound include 2,4,6-trimethylbenzoyldiphenylphosphine oxide.

Examples of the polymerization initiator (D) further include benzoin compounds such as benzoin, benzoin methyl ether, benzoin ethyl ether, benzoin isopropyl ether and benzoin isobutyl ether; benzophenone compounds such as benzophenone, methyl o-benzoylbenzoate, 4-phenylbenzophenone, 4-benzoyl-4'-methyldiphenyl sulfide, 3,3',4,4'-tetra(tert-butylperoxycarbonyl)benzophenone and 2,4,6-trimethylbenzophenone; quinone compounds such as 9,10-phenanthrenequinone, 2-ethylanthraquinone and camphor quinone; and 10-butyl-2-chloroacridone, benzil, methyl phenylglyoxylate, and a titanocene compound. Such a compound is preferably used in combination with a polymerization initiation aid (D1) (in particular, amine) described below.

The content of the polymerization initiator (D) is preferably 0.1 to 30 parts by mass, more preferably 3 to 25 parts by mass, further preferably 5 to 20 parts by mass based on 100 parts by mass of the total amount of the resin (B) and the polymerizable compound (C). In a case where the content of the polymerization initiator (D) falls within the range, an increase in sensitivity tends to result in a decrease in exposure time, and thus productivity of a blue color filter tends to be enhanced.

[5] Polymerization Initiation Aid (D1)

The polymerization initiation aid (D1) is a compound or sensitizer to be used in order to promote polymerization of a polymerizable compound whose polymerization is initiated by the polymerization initiator. The polymerization initiation aid (D1), when included, is used as a combination with the polymerization initiator (D).

Examples of the polymerization initiation aid (D1) include an amine compound, an alkoxyanthracene compound, a thioxanthone compound and a carboxylic acid compound. Among them, a thioxanthone compound is preferable. Such polymerization initiation aids (D1) may be used in combinations of two or more thereof.

Examples of the amine compound include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethylparatoluidine, 4,4'-bis(dimethylamino)benzophenone (commonly called Michler's ketone), 4,4'-bis(diethylamino)benzophenone and 4,4'-bis(ethylmethylamino)benzophenone, and among them, 4,4'-bis(diethylamino)benzophenone is preferable. A commercially available product such as EAB-F (manufactured by Hodogaya Chemical Co., Ltd.) may also be used.

Examples of the alkoxyanthracene compound include 9,10-dimethoxyanthracene, 2-ethyl-9,10-dimethoxyanthracene, 9,10-diethoxyanthracene, 2-ethyl-9,10-diethoxyanthracene, 9,10-dibutoxyanthracene and 2-ethyl-9,10-dibutoxyanthracene.

Examples of the thioxanthone compound include 2-isopropylthioxanthone, 4-isopropylthioxanthone, 2,4-diethylthioxanthone, 2,4-dichlorothioxanthone and 1-chloro-4-propoxythioxanthone.

Examples of the carboxylic acid compound include phenylsulfanylacetic acid, methylphenylsulfanylacetic acid, ethylphenylsulfanylacetic acid, methylethylphenylsulfanylacetic acid, dimethylphenylsulfanylacetic acid, methoxyphenylsulfanylacetic acid, dimethoxyphenylsulfanylacetic acid, chlorophenylsulfanylacetic acid, dichlorophenylsulfanylacetic acid, N-phenylglycine, phenoxyacetic acid, naphthylthioacetic acid, N-naphthylglycine and naphthoxyacetic acid.

The content of the polymerization initiation aid (D1) is preferably 0.1 to 30 parts by mass, more preferably 1 to 20 parts by mass based on 100 parts by mass of the total amount of the resin (B) and the polymerizable compound (C). In a case where the content of the polymerization initiation aid (D1) falls within the range, a blue pattern can be formed at a higher sensitivity and productivity of a blue color filter tends to be enhanced.

[6] Thiol Compound (T)

The blue curable resin composition of the present invention may contain one or more thiol compounds (T). Such a thiol compound (T) is particularly preferably used when the polymerization initiator (D) corresponds to an oxime-based compound such as an O-acyloxime compound, and/or a biimidazole compound. Such a thiol compound (T) is a compound having at least one sulfanyl group (—SH) in its molecule. Such a thiol compound (T) is preferably a compound having one sulfanyl group in its molecule.

Examples of the compound having one sulfanyl group in its molecule include 2-sulfanyloxazole, 2-sulfanylthiazole, 2-sulfanylbenzimidazole, 2-sulfanylbenzothiazole, 2-sulfanylbenzooxazole, 2-sulfanylnicotinic acid, 2-sulfanylpyridine, 2-sulfanylpyridin-3-ol, 2-sulfanylpyridine-N-oxide, 4-amino-6-hydroxy-2-sulfanylpyrimidine, 4-amino-6-hydroxy-2-sulfanylpyrimidine, 4-amino-2-sulfanylpyrimidine, 6-amino-5-nitroso-2-thiouracil, 4,5-diamino-6-hydroxy-2-sulfanylpyrimidine, 4,6-diamino-2-sulfanylpyrimidine, 2,4-diamino-6-sulfanylpyrimidine, 4,6-dihydroxy-2-sulfanylpyrimidine, 4,6-dimethyl-2-sulfanylpyrimidine, 4-hydroxy-2-sulfanyl-6-methylpyrimidine, 4-hydroxy-2-sulfanyl-6-propylpyrimidine, 2-sulfanyl-4-methylpyrimidine, 2-sulfanylpyrimidine, 2-thiouracil, 3,4,5,6-tetrahydropyrimidine-2-thiol, 4,5-diphenylimidazole-2-thiol, 2-sulfanylimidazole, 2-sulfanyl-1-methylimidazole, 4-amino-3-hydrazino-5-sulfanyl-1,2,4-triazole, 3-amino-5-sulfanyl-1,2,4- triazole, 2-methyl-4H-1,2,4-triazole-3-thiol, 4-methyl-4H-1,2,4-triazole-3-thiol, 3-sulfanyl 1H-1,2,4-triazole-3-thiol, 2-amino-5-sulfanyl-1,3,4-thiadiazole, 5-amino-1,3,4-thiadiazole-2-thiol, 2,5-disulfanyl-1,3,4-thiadiazole, (furan-2-yl) methanethiol, 2-sulfanyl-5-thiazolidone, 2-sulfanylthiazoline, 2-sulfanyl-4 (3H)-quinazolinone, 1-phenyl-1H-tetrazole-5-thiol, 2-quinoline thiol, 2-sulfanyl-5-methylbenzimidazole, 2-sulfanyl-5-nitrobenzimidazole, 6-amino-2-sulfanylbenzothiazole, 5-chloro-2-sulfanylbenzothiazole, 6-ethoxy-2-sulfanylbenzothiazole, 6-nitro-2-sulfanylbenzothiazole, 2-sulfanylnaphthimidazole, 2-sulfanylnaphthooxazole, 3-sulfanyl-1,2,4-triazole, 4-amino-6-sulfanylpyrazolo[2,4-d]pyridine, 2-amino-6-purinethiol, 6-sulfanylpurine and 4-sulfanyl-1H-pyrazolo[2,4-d]pyrimidine.

Examples of the compound having two or more sulfanyl groups in its molecule include hexanedithiol, decanedithiol, 1,4-bis(methylsulfanyl)benzene, butanediol bis(3-sulfanylpropionate), butanediol bis(3-sulfanylacetate), ethylene glycol bis(3-sulfanylacetate), trimethylolpropane tris(3-sulfanylacetate), butanediol bis(3-sulfanylpropionate), trimethylolpropane tris(3-sulfanylpropionate), trimethylolpropane tris(3-sulfanylacetate), pentaerythritol tetrakis(3-sulfanylpropionate), pentaerythritol tetrakis(3-sulfanylacetate), trishydroxyethyltris(3-sulfanylpropionate), pentaerythritol tetrakis(3-sulfanylbutylate) and 1,4-bis(3-sulfanylbutyloxy)butane.

The content of the thiol compound (T) is preferably 0.5 to 50 parts by mass, more preferably 5 to 45 parts by mass, further preferably 10 to 40 parts by mass based on 100 parts by mass of the polymerization initiator (D). In a case where the content of the thiol compound (T) falls within the range, an increase in sensitivity tends to result in an improvement in developability.

[7] Solvent (E)

The blue curable resin composition of the present invention preferably includes one or more solvents (E). Examples of such a solvent (E) include an ester solvent (solvent containing —COO—), an ether solvent (solvent containing —O—) other than an ester solvent, an ether ester solvent (solvent containing —COO— and —O—), a ketone solvent (solvent containing —CO—) other than an ester solvent, an alcohol solvent, an aromatic hydrocarbon solvent, an amide solvent and dimethylsulfoxide.

Examples of the ester solvent include methyl lactate, ethyl lactate, butyl lactate, methyl 2-hydroxyisobutanoate, ethyl acetate, n-butyl acetate, isobutyl acetate, pentyl formate, isopentyl acetate, butyl propionate, isopropyl butyrate, ethyl butyrate, butyl butyrate, methyl pyruvate, ethyl pyruvate, propyl pyruvate, methyl acetoacetate, ethyl acetoacetate, cyclohexanol acetate and γ-butyrolactone.

Examples of the ether solvent include ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monopropyl ether, propylene glycol monobutyl ether, 3-methoxy-1-butanol, 3-methoxy-3-methylbutanol, tetrahydrofuran, tetrahydropyran, 1,4-dioxane, diethylene glycol dimethyl ether, diethylene glycol diethyl ether, diethylene glycol methyl ethyl ether, diethylene glycol dipropyl ether, diethylene glycol dibutyl ether, anisole, phenetole and methylanisole.

Examples of the ether ester solvent include methyl methoxyacetate, ethyl methoxyacetate, butyl methoxyacetate, methyl ethoxyacetate, ethyl ethoxyacetate, methyl 3-methoxypropionate, ethyl 3-methoxypropionate, methyl 3-ethoxypropionate, ethyl 3-ethoxypropionate, methyl 2-methoxypropionate, ethyl 2-methoxypropionate, propyl 2-methoxypropionate, methyl 2-ethoxypropionate, ethyl 2-ethoxypropionate, methyl 2-methoxy-2-methylpropionate, ethyl 2-ethoxy-2-methylpropionate, 3-methoxybutyl acetate, 3-methyl-3-methoxybutyl acetate, propylene glycol monomethyl ether acetate, propylene glycol monoethyl ether acetate, propylene glycol monopropyl ether acetate, ethylene glycol monomethyl ether acetate, ethylene glycol monoethyl ether acetate, diethylene glycol monoethyl ether acetate, diethylene glycol monobutyl ether acetate and dipropylene glycol methyl ether acetate.

Examples of the ketone solvent include 4-hydroxy-4-methyl-2-pentanone, acetone, 2-butanone, 2-heptanone, 3-heptanone, 4-heptanone, 4-methyl-2-pentanone, cyclopentanone, cyclohexanone and isophorone.

Examples of the alcohol solvent include methanol, ethanol, propanol, butanol, hexanol, cyclohexanol, ethylene glycol, propylene glycol and glycerin. Examples of the aromatic hydrocarbon solvent include benzene, toluene, xylene and mesitylene. Examples of the amide solvent include N,N-dimethylformamide, N,N-dimethylacetamide and N-methylpyrrolidone.

Such a solvent (E) preferably includes an organic solvent having a boiling point of 120° C. or more and 180° C. or less at 1 atm, in terms of coating properties and drying properties. In particular, such a solvent (E) preferably includes at least one selected from the group consisting of propylene glycol monomethyl ether acetate, ethyl lactate, propylene glycol monomethyl ether, ethyl 3-ethoxypropionate, ethylene glycol monomethyl ether, diethylene glycol monomethyl ether, diethylene glycol monoethyl ether, 3-methoxybutyl acetate, 3-methoxy-1-butanol, 4-hydroxy-4-methyl-2-pentanone and N,N-dimethylformamide, more preferably includes at least one selected from the group consisting of propylene glycol monomethyl ether acetate, propylene glycol monomethyl ether, dipropylene glycol methyl ether acetate, ethyl lactate, 3-methoxybutyl acetate, 3-methoxy-1-butanol and ethyl 3-ethoxypropionate.

The content of the solvent (E) in the blue curable resin composition is preferably 70 to 95% by mass, more preferably 75 to 92% by mass. In other words, the solid content of the blue curable resin composition is preferably 5 to 30% by mass, more preferably 8 to 25% by mass. In a case where the content of the solvent (E) falls within the range, flatness in coating tends to be improved, and display properties tend to be improved because the color density in formation of a blue color filter is not inferior.

[8] Leveling Agent (F)

The blue curable resin composition of the present invention can include one or more leveling agents (F). Examples of the leveling agent (F) include a silicone-based surfactant (having no fluorine atom), a fluorine-based surfactant, and a silicone-based surfactant having a fluorine atom. Such an agent may also have a polymerizable group at a side chain.

Examples of the silicone-based surfactant include a surfactant having a siloxane bond in its molecule. Specifically, examples thereof include Toray Silicone DC3PA, SH7PA, DC11PA, SH21PA, SH28PA, SH29PA, SH30PA and SH8400 (trade name: manufactured by Dow Corning Toray Co., Ltd.), KP321, KP322, KP323, KP324, KP326, KP340 and KP341 (manufactured by Shin-Etsu Chemical Co., Ltd.), and TSF400, TSF401, TSF410, TSF4300, TSF4440, TSF4445, TSF-4446, TSF4452 and TSF4460 (manufactured by Momentive Performance Materials Japan LLC).

Examples of the fluorine-based surfactant include a surfactant having a fluorocarbon chain in its molecule. Specifically, examples thereof include Flolade (registered trademark) FC430 and FC431 (manufactured by Sumitomo 3M Ltd.), Megafac (registered trademark) F142D, F171, F172, F173, F177, F183, F554, R30 and RS-718-K (manufactured by DIC Corporation), Eftop (registered trademark) EF301, EF303, EF351, EF352 (manufactured by Mitsubishi Materials Electronic Chemicals Co., Ltd.), Surflon (registered trademark) S381, S382, SC101 and SC105 (manufactured by AGC Inc.), and E5844 (manufactured by Daikin Fine Chemicals Research Center).

Examples of the silicone-based surfactant having a fluorine atom include a surfactant having a siloxane bond and a fluorocarbon chain in its molecule. Specifically, examples thereof include Megafac (registered trademark) R08, BL20, F475, F477 and F443 (manufactured by DIC Corporation).

The content of the leveling agent (F) in the blue curable resin composition is usually 0.001% by mass or more and 0.6% by mass or less, preferably 0.002% by mass or more and 0.4% by mass or less, more preferably 0.005% by mass or more and 0.2% by mass or less. Such a content does not include the content of the pigment dispersant.

[9] Antioxidant (G)

The blue curable resin composition preferably contains an antioxidant from the viewpoint that heat resistance and light resistance of the colorant (A) are enhanced. The antioxidant is not particularly limited as long as the antioxidant is industrially commonly used, and, for example, a phenol-based antioxidant, a phosphorus-based antioxidant, and a sulfur-based antioxidant can be used. Such antioxidants may be used in combinations of two or more thereof.

Examples of the phenol-based antioxidant include Irganox 1010 (pentaerythritol tetrakis[3-(3,5-di-tert-butyl-4-hydroxyphenyl) propionate], manufactured by BASF SE), Irganox 1076 (octadecyl-3-(3,5-di-tert-butyl-4-hydroxyphenyl)propionate, manufactured by BASF SE), Irganox 1330 (3,3',3'',5,5',5''-hexa-tert-butyl-a,a',a''-(mesitylene-2,4,6-triyl)tri-p-cresol, manufactured by BASF SE), Irganox 3114 (1,3,5-tris(3,5-di-tert-butyl-4-hydroxybenzyl)-1,3,5-triazine-2,4,6(1H,3H,5H)-trione, manufactured by BASF SE), Irganox 3790 (1,3,5-tris((4-tert-butyl-3-hydroxy-2,6-xylyl)methyl)-1,3,5-triazine-2,4,6 (1H,3H,5H)-trione, manufactured by BASF SE), Irganox 1035 (thiodiethylenebis[3-(3,5-di-tert-butyl-4-hydroxyphenyl)propionate], manufactured by BASF SE), Irganox 1135 (benzenepropanoic acid, 3,5-bis(1,1-dimethylethyl)-4-hydroxy, C7-C9 branched alkyl ester, manufactured by BASF SE), Irganox 1520L (4,6-bis(octylthiomethyl)-o-cresol, manufactured by BASF SE), Irganox 3125 (manufactured by BASF SE), Irganox 565 (2,4-bis(n-octylthio)-6-(4-hydroxy 3',5'-di-tert-butylanilino)-1,3,5-triazine, manufactured by BASF SE), Adekastab AO-80 (3,9-bis(2-(3-(3-tert-butyl-4-hydroxy-5-methylphenyl)propionyloxy)-1,1-dimethylethyl)-2,4,8,10-tetraoxaspiro(5,5)undecane manufactured by Adeka Corporation), Sumilizer BHT (manufactured by Sumitomo Chemical Co., Ltd.), Sumilizer GA-80 (manufactured by Sumitomo Chemical Co., Ltd.), Sumilizer GS (manufactured by Sumitomo Chemical Co., Ltd.), Cyanox 1790 (manufactured by Cytec), and Vitamin E (manufactured by Esai Co., Ltd.).

Examples of the phosphorus-based antioxidant include Irgafos 168 (tris(2,4-di-tert-butylphenyl)phosphite, manufactured by BASF SE), Irgafos 12 (tris[2-[[2,4,8,10-tetra-tert-butyldibenzo[d,f][1,3,2]dioxaphosphin-6-yl]oxy]ethyl] amine, manufactured by BASF SE), Irgafos 38 (bis(2,4-bis (1,1-dimethylethyl)-6-methylphenyl)ethyl ester phosphorus acid, manufactured by BASF SE), Adekastab 329K (manufactured by Adeka Corporation), Adekastab PEP36 (manufactured by Adeka Corporation), Adekastab PEP-8 (manufactured by Adeka Corporation), Sandstab P-EPQ (manufactured by Clariant AG), Weston 618 (manufactured by GE Specialty Chemicals), Weston 619G (manufactured by GE Specialty Chemicals), Ultranox 626 (manufactured by GE Specialty Chemicals), and Sumilizer GP (6-[3-(3-tert-butyl-4-hydroxy-5-methylphenyl)propoxy]-2,4,8,10-tetra-tert-butyldibenz[d,f][1.3.2]dioxaphosphepin) (manufactured by Sumitomo Chemical Co., Ltd.).

Examples of the sulfur-based antioxidant include dialkyl thiodipropionate compounds such as dilauryl, dimyristyl or distearyl thiodipropionate, and β-alkyl mercaptopropionic acid ester compounds of polyols, such as tetrakis[methylene (3-dodecylthio)propionate]methane.

The content of the antioxidant (G) in the blue curable resin composition is usually 0.01% by mass or more and 5% by mass or less, preferably 0.04% by mass or more and 3% by mass or less, more preferably 0.07% by mass or more and 1% by mass or less.

[10] Other Component

The blue curable resin composition of the present invention can contain, if necessary, one or more additives such as a filler, a polymer compound other than the resin (B), an acceleration agent, an ultraviolet absorber, an aggregation prevention agent, an organic acid, an organic amine compound and a curing agent.

Examples of the filler include glass, silica and alumina. Examples of the polymer compound other than the resin (B) include polyvinyl alcohol, polyacrylic acid, polyethylene glycol monoalkyl ether and polyfluoroalkyl acrylate.

Examples of the acceleration agent include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloyloxypropyltrimethoxysilane and 3-mercaptopropyltrimethoxysilane.

Examples of the ultraviolet absorber include benzotriazole-based compounds such as 2-(2-hydroxy-3-tert-butyl-5-methylphenyl)-5-chlorobenzotriazole; benzophenone-based compounds such as 2-hydroxy-4-octyloxybenzophenone; benzoate-based compounds such as 2,4-di-tert-butylphenyl-3,5-di-tert-butyl-4-hydroxybenzoate; and triazine-based compounds such as 2-(4,6-diphenyl-1,3,5-triazin-2-yl)-5-hexyloxyphenol. Examples of the aggregation prevention agent include sodium polyacrylate.

An organic acid is used for adjustment of developability, and specific examples thereof include aliphatic monocarboxylic acids such as formic acid, acetic acid, propionic acid, butyric acid, valeric acid, pivalic acid, caproic acid, diethylacetic acid, enanthic acid and caprylic acid;

aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, cyclohexanedicarboxylic acid, itaconic acid, citraconic acid, maleic acid, fumaric acid and mesaconic acid;

aliphatic tricarboxylic acids such as tricarballylic acid, aconitic acid and camphoronic acid;

aromatic monocarboxylic acids such as benzoic acid, toluic acid, cuminic acid, hemellitic acid and mesitylenic acid;

aromatic dicarboxylic acids such as phthalic acid, isophthalic acid and terephthalic acid; and aromatic polycarboxylic acids such as trimellitic acid, trimesic acid, mellophanic acid and pyromellitic acid.

Examples of the organic amine compound include monoalkylamines such as n-propylamine, isopropylamine, n-butylamine, isobutylamine, sec-butylamine, tert-butylamine, n-pentylamine, n-hexylamine, n-heptylamine, n-octylamine, n-nonylamine, n-decylamine, n-undecylamine and n-dodecylamine;

monocycloalkylamines such as cyclohexylamine, 2-methylcyclohexylamine, 3-methylcyclohexylamine and 4-methylcyclohexylamine;

dialkylamines such as methylethylamine, diethylamine, methyl n-propylamine, ethyl n-propylamine, di-n-propylamine, diisopropylamine, di-n-butylamine, diisobutylamine, di-sec-butylamine, di-tert-butylamine, di-n-pentylamine and di-n-hexylamine;

monoalkylmonocycloalkylamines such as methylcyclohexylamine and ethylcyclohexylamine;

dicycloalkylamines such as dicyclohexylamine;

trialkylamines such as dimethylethylamine, methyldiethylamine, triethylamine, dimethyl-n-propylamine, diethyl-n-propylamine, methyl di-n-propylamine, ethyl di-n-propylamine, tri-n-propylamine, triisopropylamine, tri-n-butylamine, triisobutylamine, tri-sec-butylamine, tri-tert-butylamine, tri-n-pentylamine and tri-n-hexylamine;

dialkylmonocycloalkylamines such as dimethylcyclohexylamine and diethylcyclohexylamine;

monoalkyldicycloalkylamines such as methyldicyclohexylamine, ethyldicyclohexylamine and tricyclohexylamine;

monoalkanolamine such as 2-aminoethanol, 3-amino-1-propanol, 1-amino-2-propanol, 4-amino-1-butanol, 5-amino-1-pentanol and 6-amino-1-hexanol;

monocycloalkanolamines such as 4-amino-1-cyclohexanol;

dialkanolamines such as diethanolamine, di-n-propanolamine, diisopropanolamine, di-n-butanolamine, diisobutanolamine, di-n-pentanolamine and di-n-hexanolamine;

dicycloalkanolamines such as di(4-cyclohexanol)amine;

trialkanolamines such as triethanolamine, tri-n-propanolamine, triisopropanolamine, tri-n-butanolamine, triisobutanolamine, tri-n-pentanolamine and tri-n-hexanolamine;

tricycloalkanolamines such as tri(4-cyclohexanol)amine;

aminoalkanediols such as 3-amino-1,2-propanediol, 2-amino-1,3-propanediol, 4-amino-1,2-butanediol, 4-amino-1,3-butanediol, 3-dimethylamino-1,2-propanediol, 3-diethylamino-1,2-propanediol, 2-dimethylamino-1,3-propanediol and 2-diethylamino-1,3-propanediol;

aminocycloalkanediols such as 4-amino-1,2-cyclohexanediol and 4-amino-1,3-cyclohexanediol;

amino group-containing cycloalkanone methanols such as 1-aminocyclopentanonemethanol and 4-aminocyclopentanonemethanol;

amino group-containing cycloalkane methanols such as 1-aminocyclohexanonemethanol, 4-aminocyclohexanonemethanol, 4-dimethylaminocyclopentanemethanol, 4-diethylaminocyclopentanemethanol, 4-dimethylaminocyclohexanemethanol and 4-diethylaminocyclohexanemethanol;

aminocarboxylic acids such as β-alanine, 2-aminobutyric acid, 3-aminobutyric acid, 4-aminobutyric acid, 2-aminoisobutyric acid, 3-aminoisobutyric acid, 2-aminovaleric acid, 5-aminovaleric acid, 6-aminocaproic acid, 1-aminocyclopropanecarboxylic acid, 1-aminocyclohexanecarboxylic acid and 4-aminocyclohexanecarboxylic acid;

aromatic amines such as aniline, o-methylaniline, m-methylaniline, p-methylaniline, p-ethylaniline, p-n-propylaniline, p-isopropylaniline, p-n-butylaniline, p-tert-butylaniline, 1-naphthylamine, 2-naphthylamine, N,N-dimethylaniline, N,N-diethylaniline and p-methyl-N,N-dimethylaniline;

aminobenzyl alcohols such as o-aminobenzyl alcohol, m-aminobenzyl alcohol, p-aminobenzyl alcohol, p-dimethylaminobenzyl alcohol and p-diethylaminobenzyl alcohol;

aminophenols such as o-aminophenol, m-aminophenol, p-aminophenol, p-dimethylaminophenol and p-diethylaminophenol; and aminobenzoic acids such as m-aminobenzoic acid, p-aminobenzoic acid, p-dimethylaminobenzoic acid and p-diethylaminobenzoic acid.

Examples of the curing agent include a compound which can be heated to thereby react with a carboxy group in the resin (B), thereby crosslinking the resin (B), and a compound which can be homo-polymerized for curing, thereby providing a blue color filter, and examples thereof include an epoxy compound and an oxetane compound. Such curing agents may be used singly or in combinations of two or more thereof.

Examples of the epoxy compound include epoxy resins such as a bisphenol A-based epoxy resin, a hydrogenated bisphenol A-based epoxy resin, a bisphenol F-based epoxy resin, a hydrogenated bisphenol F-based epoxy resin, a novolac-type epoxy resin, other aromatic epoxy resin, an alicyclic epoxy resin, a heterocyclic epoxy resin, a glycidyl ester-based resin, a glycidyl amine-based resin and epoxidized oil, a brominated derivative of such an epoxy resin, an aliphatic, alicyclic or aromatic epoxy compound other than such an epoxy resin and a brominated derivative thereof, a epoxidized product of a (co)polymer of butadiene, a epoxidized product of a (co)polymer of isoprene, a (co)polymer of glycidyl (meth)acrylate, and triglycidyl isocyanurate. Examples of a commercially available product of such an epoxy resin include an o-cresol novolac-type epoxy resin and "SUMI-EPDXY (registered trademark) ESCN-195XL-80" (manufactured by Sumitomo Chemical Co., Ltd.).

Examples of the oxetane compound include carbonate bisoxetane, xylylene bisoxetane, adipate bisoxetane, terephthalate bisoxetane and cyclohexanedicarboxylic acid bisoxetane.

In a case where the blue curable resin composition of the present invention contains an epoxy compound, an oxetane compound or the like as the curing agent, the composition may contain a compound which can allow for ring-opening polymerization of an epoxy group of such an epoxy compound and an oxetane backbone of such an oxetane compound. Examples of such a compound include polyvalent carboxylic acid, polyvalent carboxylic anhydride and an acid generator.

Examples of the polyvalent carboxylic acid include aromatic polyvalent carboxylic acids such as 3,4-dimethylphthalic acid, pyromellitic acid, trimellitic acid, 1,4,5,8-naphthalenetetracarboxylic acid and 3,3',4,4'-benzophenonetetracarboxylic acid;

aliphatic polyvalent carboxylic acids such as 1,2,3,4-butanetetracarboxylic acid; and alicyclic polyvalent carboxylic acids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4- cyclohexanetricarboxylic acid, cyclopentanetetracarboxylic acid and 1,2,4,5-cyclohexanetetracarboxylic acid.

Examples of the polyvalent carboxylic anhydride include aromatic polyvalent carboxylic anhydrides such as phthalic anhydride, pyromellitic anhydride, trimellitic anhydride and 3,3',4,4'-benzophenonetetracarboxylic dianhydride;

aliphatic polyvalent carboxylic anhydrides such as itaconic anhydride, succinic anhydride, citraconic anhydride, dodecenylsuccinic anhydride, tricarballylic anhydride, maleic anhydride and 1,2,3,4-butanetetracarboxylic dianhydride;

alicyclic polyvalent carboxylic anhydrides such as hexahydrophthalic anhydride, 3,4-dimethyltetrahydrophthalic anhydride, 1,2,4-cyclopentanetricarboxylic anhydride, 1,2,4-cyclohexanetricarboxylic anhydride, cyclopentanetetracarboxylic dianhydride, 1,2,4,5-cyclohexanetetracarboxylic dianhydride, himic anhydride and nadic anhydride; and ester group-containing carboxylic anhydrides such as ethylene glycol bistrimellitic acid and glycerin tristrimellitic anhydride.

Any carboxylic anhydride which is commercially available as an epoxy resin curing agent may be used. Examples of such an epoxy resin curing agent include trade name "Adeka Hardener (registered trademark) EH-700" (manufactured by Adeka Corporation), trade name "Rikacid (registered trademark) HH" (manufactured by New Japan Chemical Co., Ltd.) and trade name "MH-700" (manufactured by New Japan Chemical Co., Ltd.).

Examples of the acid generator include onium salts such as 4-hydroxyphenyldimethylsulfonium p-toluenesulfonate, 4-hydroxyphenyldimethylsulfonium hexafluoroantimonate, 4-acetoxyphenyldimethylsulfonium p-toluenesulfonate, 4-acetoxyphenyl-methyl-benzylsulfonium hexafluoroantimonate, triphenylsulfonium p-toluenesulfonate, triphenylsulfonium hexafluoroantimonate, diphenyliodonium p-toluenesulfonate and diphenyliodonium hexafluoroantimonate, and nitrobenzyl tosylate and benzoin tosylate.

<Method for Producing Blue Curable Resin Composition>

The blue curable resin composition of the present invention can be prepared by mixing the colorant (A), the resin (B), the polymerizable compound (C) and the polymerization initiator (D), and, if necessary, the solvent (E), the thiol compound (T), the leveling agent (F), the polymerization initiation aid (D1), the antioxidant (G) and any other component.

<Blue Color Filter and Method for Producing Same, Blue Color Filter, and Display Device>

The blue curable resin composition of the present invention is useful as a material of a blue color filter. A blue color filter formed from the blue curable resin composition of the present invention is also in the category of the present invention. A blue pattern may be formed in such a blue color filter.

Examples of a method for producing such a blue pattern from the blue curable resin composition of the present invention include a photolithography method, an inkjet method and a printing method, preferably include a photolithography method. A photolithography method is a method including coating a substrate with a blue curable resin composition, drying the resultant to form a blue composition layer, and exposing and developing the blue composition layer through a photomask. A blue coating film as a cured product of the blue composition layer can be formed by not using and/or not developing any photomask in exposure in such a photolithography method. Such blue pattern and blue coating film formed from the blue curable resin composition of the present invention correspond to the blue color filter of the present invention. The blue color filter according to the present invention is typically used as a blue pixel.

The substrate here used can be a plate of glass such as quartz glass, borosilicate glass, aluminosilicate glass, or soda lime glass whose surface is coated with silica, a plate of a resin such as polycarbonate, polymethyl methacrylate or polyethylene terephthalate, silicon, or such a substrate on which an aluminum, silver, silver/copper/palladium alloy thin film is formed. Another color filter layer, a resin layer, a transistor, a circuit, and the like may also be formed on such a substrate.

Formation of each pixel according to a photolithography method can be performed in any known or traditional apparatus and/or conditions, and, for example, can be made as follows. First, the substrate is coated with the blue curable resin composition, and heated and dried (pre-baked) and/or dried under reduced pressure to thereby remove a volatile component, for example, the solvent, thereby providing a smooth blue composition layer. Examples of the coating method include a spin coating method, a slit coating method and a slit and spin coating method.

The temperature in the case of heating and drying is preferably 30 to 120° C., more preferably 50 to 110° C. The heating time is preferably 10 seconds to 5 minutes, more preferably 30 seconds to 3 minutes. Drying under reduced pressure, when performed, is preferably performed under a pressure of 50 to 150 Pa in the temperature range from 20 to 25° C. The film thickness of the blue composition layer is not particularly limited, and may be appropriately selected depending on the film thickness of the intended blue color filter.

Next, the blue composition layer is exposed through a photomask for formation of the intended blue pattern. The pattern on the photomask is not particularly limited, and any pattern is used depending on the intended use. A light source for use in such exposure is preferably a light source which emits light at a wavelength of 250 to 450 nm. For example, light at a wavelength of less than 350 nm may be cut by use of a filter which cuts light in the wavelength region, or light at wavelengths of about 436 nm, about 408 nm, and about 365 nm may be selectively picked up by use of a bandpass filter which picks up light at such wavelengths.

Specific examples of the light source include a mercury lamp, a light-emitting diode, a metal halide lamp and a halogen lamp.

An exposure apparatus such as a mask aligner or a stepper is preferably used for such exposure because such an apparatus can radiate parallel beam on the entire exposure surface and can accurately align the photomask and the substrate on which the blue composition layer is formed.

The blue composition layer after such exposure is brought into contact with a developer and thus developed, thereby allowing a blue pattern to be formed on the substrate. Such developing allows an unexposed region of the blue composition layer to be dissolved in the developer and thus removed.

The developer is preferably an aqueous solution of an alkaline compound such as potassium hydroxide, sodium hydrogen carbonate, sodium carbonate or tetramethylammonium hydroxide. The concentration of such an alkaline compound in the aqueous solution is preferably 0.01 to 10% by mass, more preferably 0.03 to 5% by mass. The developer may further include a surfactant.

The developing method may be any of a puddling method, a dipping method, a spraying method and the like. Furthermore, the substrate may also be inclined at any angle in such developing. After such developing, washing with water is preferably made.

Furthermore, the resulting blue pattern is preferably post-baked. The post-baking temperature is preferably 150 to 250° C., more preferably 160 to 235° C. The post-baking time is preferably 1 to 120 minutes, more preferably 10 to 60 minutes.

The film thickness of the resulting blue coating film has any influence on an adjacent pixel and thus is preferably small as much as possible. In particular, a large thickness may cause light from the light source to pass though pixels of two or more colors and be leaked out in production of a liquid crystal panel, resulting in the loss of color vividness in viewing of the panel in an oblique manner. The film thickness of the blue coating film after such post-baking is generally preferably 3 µm or less, more preferably 2.8 µm or less. The lower limit of the film thickness of the blue coating film is not particularly limited, and is usually 1 µm or more and may be 1.5 µm or more. The blue coating film can exhibit excellent developability, and is suitable as the material of the blue color filter.

A higher intensity of the blue coating film is more preferable, the intensity is preferably 9 or more, more preferably 10.5 or more, and the upper limit thereof is not particularly limited and is usually 15 or less.

The blue color filter according to the present invention is useful as a blue color filter for use in a display device (liquid crystal display device, organic EL device, electronic paper, and the like) and a solid-state image sensing device.

EXAMPLES

Hereinafter, the present invention will be more specifically described with reference to Examples and Comparative Examples, but the present invention is not limited by such Examples. In the Examples, "%" and "part(s)" representing the content or the amount of use are on a mass basis, unless particularly noted.

Synthesis Example 1: Pigment Dispersion (A1)

| C.I. Pigment Blue 15 | 12.1 parts |
|---|---|
| Acrylic pigment dispersant | 4.2 parts |
| Propylene glycol monomethyl ether acetate | 83.7 parts |

These were mixed and the pigment was sufficiently dispersed by use of a bead mill, thereby providing pigment dispersion (A1) containing C.I. Pigment Blue 15.

Synthesis Example 2: Pigment Dispersion (A2)

| C.I. Pigment Blue 15:6 | 12.0 parts |
|---|---|
| Acrylic pigment dispersant | 2.0 parts |
| Propylene glycol monomethyl ether acetate | 86.0 parts |

These were mixed and the pigment was sufficiently dispersed by use of a bead mill, thereby providing pigment dispersion (A2) containing C.I. Pigment Blue 15:6.

Synthesis Example 3: Pigment Dispersion (A3)

| C.I. Pigment Blue 15:4 | 12.1 parts |
|---|---|
| Acrylic pigment dispersant | 3.6 parts |
| Propylene glycol monomethyl ether acetate | 84.3 parts |

These were mixed and the pigment was sufficiently dispersed by use of a bead mill, thereby providing pigment dispersion (A3) containing C.I. Pigment Blue 15:4.

Synthesis Example 4: Pigment Dispersion (A4)

| C.I. Pigment Blue 16 | 12.1 parts |
|---|---|
| Acrylic pigment dispersant | 3.6 parts |
| Propylene glycol monomethyl ether acetate | 84.3 parts |

These were mixed and the pigment was sufficiently dispersed by use of a bead mill, thereby providing pigment dispersion (A4) containing C.I. Pigment Blue 16.

Synthesis Example 5: Preparation of Resin (B)

Nitrogen was allowed to sufficiently flow into a flask equipped with a reflux condenser, a dropping funnel and a stirrer to provide a nitrogen atmosphere, 200 parts of 3-methoxy-1-butanol and 105 parts of 3-methoxybutyl acetate were placed in the flask and heated to 70° C. with stirring. Next, 60 parts of methacrylic acid and 240 parts of 3,4-epoxytricyclo[5.2.1.0$^{2.6}$]decyl acrylate were dissolved in 140 parts of 3-methoxybutyl acetate to prepare a solution, and the solution was dropped into the flask warmed to 70° C., by use of the dropping funnel over 4 hours.

On the other hand, a mixed solution where 30 parts of 2,2-azobis(2,4-dimethylvaleronitrile) was dissolved in 225 parts of 3-methoxybutyl acetate was dropped into the flask over 4 hours by use of another dropping funnel. After completion of such dropping, the resultant was retained at that temperature for 4 hours, and thereafter cooled to room temperature, thereby providing a resin solution having a solid content of 32.6% by weight and an acid value of 110 mg-KOH/g (in terms of solid content). The weight average molecular weight (Mw) and the molecular weight distribution of resin (B) included in the resulting resin solution were 13,400 and 2.50, respectively.

The weight average molecular weight (Mw) and the number average molecular weight (Mn) of resin (B) obtained were measured using a GPC method in the following conditions. The ratio (Mw/Mn) of the weight average molecular weight (Mw) and the number average molecular weight (Mn), in terms of polystyrene, obtained in the following conditions was defined as the molecular weight distribution.

The weight average molecular weight (Mw) and the number average molecular weight (Mn) of resin (B) obtained were measured using a GPC method in the following conditions. The ratio (Mw/Mn) of the weight average molecular weight (Mw) and the number average molecular weight (Mn), in terms of polystyrene, obtained in the following conditions was defined as the molecular weight distribution.

Apparatus: HLC-8120GPC (manufactured by Tosoh Corporation)
Column: TSK-GELG2000HXL
Column temperature: 40° C.
Solvent: THF
Flow rate: 1.0 mL/min
Solid content concentration of liquid to be tested: 0.001 to 0.01% by mass
Amount of injection: 50 μL
Detector: RI
Standard substance for calibration: TSK STANDARD POLYSTYRENE F-40, F-4, F-288, A-2500, A-500 (manufactured by Tosoh Corporation)

Examples 1 to 4 and Comparative Examples 1 to 8

(1) Preparation of Blue Curable Resin Composition

A blue curable resin composition was obtained by mixing each of pigment dispersions (A1) to (A4) obtained in Synthesis Examples 1 to 4 or the resin solution including resin (B) obtained in Synthesis Example 5, and a polymerizable compound (C), a polymerization initiator (Da), a polymerization initiator (Db), a thiol compound (T) and a leveling agent (F) so that the amounts compounded were as described in Table 8.

Mixing with propylene glycol monomethyl ether acetate was here made in preparation of the blue curable resin composition so that the concentration of a color material in the solid content of the blue curable resin composition was 30% by mass. The unit of the amount of each component compounded is "parts by mass" and the amount thereof compounded is in terms of solid content, in Table 8. The detail of each component is as follows.

[Polymerizable Compound and Polymerization Initiator Used]

Polymerizable compound (C): pentaerythritol triacrylate (trade name "A-TMM-3LM-N" manufactured by Shin-Nakamura Chemical Co., Ltd.)

Polymerization initiator (Da): compound represented by the following formula.

[Formula 21]

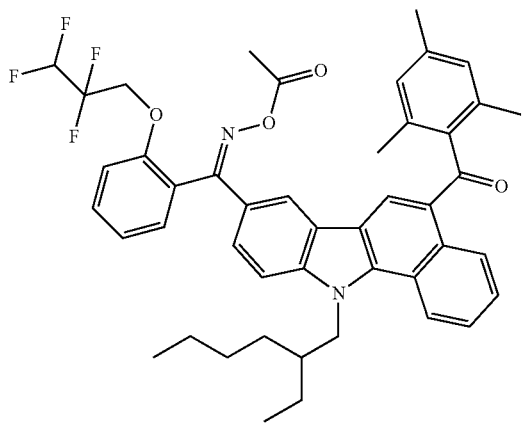

Polymerization initiator (Db): 2,2',4-tris(2-chlorophenyl)-5-(3,4-dimethoxyphenyl)-4,5-diphenyl-1,1'-biimidazole (trade name "TCDM" manufactured by CHEMBRIDGE INTERNATIONAL CORPORATION)

Thiol compound (T): 2-mercaptobenzothiazole (trade name "Sanceler M" manufactured by Sanshin Chemical Industry Co., Ltd.), Leveling agent (F): polyether-modified silicone oil (trade name "Toray Silicone SH8400" manufactured by Dow Corning Toray Co., Ltd.).

TABLE 8

| | Colorant (A) | | | | Resin | Polymerizable compound | Polymerization initiator | | Thiol compound | Leveling |
|---|---|---|---|---|---|---|---|---|---|---|
| | (A1) | (A2) | (A3) | (A4) | (B) | (C) | (Da) | (Db) | (T) | agent (F) |
| Example 1 | 2.2 | 3.8 | — | — | 7.1 | 4.7 | 0.2 | 0.4 | 0.1 | 0.01 |
| Example 2 | — | 4.2 | 1.8 | — | 7.2 | 4.8 | 0.2 | 0.4 | 0.1 | 0.01 |
| Example 3 | — | 5.3 | — | 0.7 | 7.2 | 4.8 | 0.2 | 0.4 | 0.1 | 0.01 |
| Comparative Example 1 | 6.0 | — | — | — | 6.7 | 4.4 | 0.2 | 0.4 | 0.1 | 0.01 |
| Comparative Example 2 | — | 6.0 | — | — | 7.3 | 4.9 | 0.2 | 0.5 | 0.1 | 0.01 |
| Comparative Example 3 | — | — | 6.0 | — | 6.8 | 4.6 | 0.2 | 0.5 | 0.1 | 0.01 |
| Comparative Example 4 | — | — | — | 6.0 | 6.3 | 4.2 | 0.2 | 0.4 | 0.1 | 0.01 |
| Example 4 | 4.8 | — | — | 1.2 | 6.6 | 4.4 | 0.2 | 0.4 | 0.1 | 0.01 |
| Comparative Example 5 | 6.0 | — | — | — | 6.7 | 4.4 | 0.2 | 0.4 | 0.1 | 0.01 |
| Comparative Example 6 | — | 6.0 | — | — | 7.3 | 4.9 | 0.2 | 0.5 | 0.1 | 0.01 |
| Comparative Example 7 | — | — | 6.0 | — | 6.8 | 4.6 | 0.2 | 0.5 | 0.1 | 0.01 |
| Comparative Example 8 | — | — | — | 6.0 | 6.3 | 4.2 | 0.2 | 0.4 | 0.1 | 0.01 |

(2) Production of Blue Coating Film

A 2-inch square glass substrate ("Eagle XG" manufactured by Corning Inc.) was coated with the blue curable resin composition according to a spin coating method, and thereafter pre-baked at 100° C. for 3 minutes. After cooling, the substrate coated with the blue curable resin composition was irradiated with light under an air atmosphere at an exposure dose of 80 mJ/cm$^2$ (based on 365 nm) by use of an exposing machine ("TME-150RSK" manufactured by Topcon Corporation). Thereafter, the resultant was post-baked in an oven at 230° C. for 30 minutes, thereby providing a blue coating film.

(3) Film Thickness Measurement

The film thickness of the resulting blue coating film was measured using a film thickness measuring apparatus (DEK-TAK3; manufactured by ULVAC Inc.). The results are shown in Table 9 and Table 10.

(4) Chromaticity Evaluation

The resulting blue coating film was subjected to spectrometric measurement with a colorimeter (OSP-SP-200; manufactured by Olympus Corporation), and the xy chromaticity coordinates (x, y) and the tristimulus value Y in the CIE XYZ color system were measured using characteristic functions of a C-light source. The results are shown in Table 9 and Table 10.

TABLE 9

| | Film thickness (μm) | C-light source | | |
|---|---|---|---|---|
| | | x | y | Y |
| Example 1 | 2.7 | 0.132 | 0.107 | 11.2 |
| Example 2 | 3.1 | 0.132 | 0.107 | 10.8 |
| Example 3 | 2.7 | 0.132 | 0.107 | 10.9 |
| Comparative Example 1 | 3.6 | 0.129 | 0.107 | 9.6 |
| Comparative Example 2 | 2.4 | 0.134 | 0.107 | 11.9 |
| Comparative Example 3 | 9.6 | 0.124 | 0.107 | 4.6 |
| Comparative Example 4 | 1.4 | 0.132 | 0.182 | 20.3 |

TABLE 10

| | Film thickness (μm) | C-light source | | |
|---|---|---|---|---|
| | | x | y | Y |
| Example 4 | 2.5 | 0.128 | 0.130 | 13.0 |
| Comparative Example 5 | 2.1 | 0.131 | 0.130 | 14.8 |
| Comparative Example 6 | 1.7 | 0.135 | 0.130 | 16.5 |
| Comparative Example 7 | 4.7 | 0.126 | 0.130 | 10.5 |
| Comparative Example 8 | 4.4 | 0.115 | 0.152 | 7.7 |

The y value was unified to 0.107 in Examples 1 to 3 and Comparative Examples 1 to 3. The x value in Comparative Example 4 was the same as the x value in Example 1.

The film thickness was large and the intensity was low in Comparative Examples 1 and 3. The x value was lower in Examples 1 to 3 than in Comparative Example 2, and a blue color filter wider in displayable color reproduction range and higher in saturation was obtained in each of Examples 1 to 3. The y value was higher in Comparative Example 4 than in Example 1, and a blue color filter wider in displayable color reproduction range and higher in saturation was obtained in Example 1.

The y value was unified to 0.130 in Example 4 and Comparative Examples 5 to 7, and the minimum y value which could be taken was used to determine the film thickness and the chromaticity in Comparative Example 8.

The x value was high in Comparative Examples 5 and 6, and a blue color filter wider in displayable color reproduction range and higher in saturation was obtained in Example 4. The film thickness was large and the intensity was low in Comparative Example 7. The film thickness was large and the intensity was low in Comparative Example 8.

Examples 5 to 8

Each blue curable resin composition was obtained by mixing each of pigment dispersions (A1) to (A4) obtained in Synthesis Examples 1 to 4 or the resin solution including resin (B) obtained in Synthesis Example 5, and the above polymerizable compound (C), polymerization initiator (Da), polymerization initiator (Db), thiol compound (T) and leveling agent (F) so that the amounts compounded were as described in Table 11.

Mixing with propylene glycol monomethyl ether acetate was here made in preparation of the blue curable resin composition so that the concentration of a color material in the solid content of the blue curable resin composition was 30% by mass. The unit of the amount of each component compounded is "parts by mass" and the amount thereof compounded is in terms of solid content, in Table 11. The detail of each component is as follows.

The blue curable resin composition obtained according to "(2) Production of blue coating film" described above was used to produce a blue coating film, and the film was subjected to film thickness measurement and chromaticity evaluation according to "(3) Film thickness measurement" and "(4) Chromaticity evaluation", respectively. The results are shown in Table 12.

TABLE 11

| | Colorant (A) | | | | Resin | Polymerizable compound | Polymerization initiator | | Thiol compound | Leveling agent |
|---|---|---|---|---|---|---|---|---|---|---|
| | (A1) | (A2) | (A3) | (A4) | (B) | (C) | (Da) | (Db) | (T) | (F) |
| Example 5 | 5.4 | 0.6 | — | — | 6.7 | 4.5 | 2.2 | 4.5 | 0.1 | 0.01 |
| Example 6 | 1.8 | — | — | 4.2 | 6.4 | 4.3 | 0.2 | 0.4 | 0.1 | 0.01 |
| Example 7 | — | 1.2 | 4.8 | — | 6.9 | 4.6 | 0.2 | 0.5 | 0.1 | 0.01 |
| Example 8 | — | 1.2 | — | 4.8 | 6.5 | 4.4 | 0.2 | 0.4 | 0.1 | 0.01 |

TABLE 12

|  | Film thickness (μm) | C-light source | | |
|---|---|---|---|---|
|  |  | x | y | Y |
| Example 5 | 2.5 | 0.130 | 0.120 | 12.9 |
| Example 6 | 2.5 | 0.124 | 0.150 | 13.1 |
| Example 7 | 2.5 | 0.131 | 0.143 | 16.2 |
| Example 8 | 2.5 | 0.124 | 0.150 | 12.8 |

Comparative Example 9

A blue curable resin composition was prepared in the same manner as in Example 5 except that 6.0 parts by mass of colorant A1 was used instead of 5.4 parts by mass of colorant A1 and 0.6 parts by mass of colorant A2 used in Example 5. The resulting blue curable resin composition was used to produce a blue coating film, and the film was subjected to film thickness measurement and chromaticity evaluation. As a result, the intensity was higher in Example 5 than in Comparative Example 9.

Comparative Example 10

A blue curable resin composition was prepared in the same manner as in Example 5 except that 6.0 parts by mass of colorant A2 was used instead of 5.4 parts by mass of colorant A1 and 0.6 parts by mass of colorant A2 used in Example 5. The resulting blue curable resin composition was used to produce a blue coating film, and the film was subjected to film thickness measurement and chromaticity evaluation. As a result, a blue color filter lower in x value, wider in displayable color reproduction range and higher in saturation was obtained in Example 5 than in Comparative Example 10.

Comparative Example 11

A blue curable resin composition was prepared in the same manner as in Example 6 except that 6.0 parts by mass of colorant A1 was used instead of 1.8 parts by mass of colorant A1 and 4.2 parts by mass of colorant A4 used in Example 6. The resulting blue curable resin composition was used to produce a blue coating film, and the film was subjected to film thickness measurement and chromaticity evaluation. As a result, a blue color filter lower in x value, wider in displayable color reproduction range and higher in saturation was obtained in Example 6 than in Comparative Example 11.

Comparative Example 12

A blue curable resin composition was prepared in the same manner as in Example 6 except that 6.0 parts by mass of colorant A4 was used instead of 1.8 parts by mass of colorant A1 and 4.2 parts by mass of colorant A4 used in Example 6. The resulting blue curable resin composition was used to produce a blue coating film, and the film was subjected to film thickness measurement and chromaticity evaluation. As a result, the film thickness was smaller and the intensity was higher in Example 6 than in Comparative Example 12.

Comparative Example 13

A blue curable resin composition was prepared in the same manner as in Example 7 except that 6.0 parts by mass of colorant A2 was used instead of 1.2 parts by mass of colorant A2 and 4.8 parts by mass of colorant A3 used in Example 7. The resulting blue curable resin composition was used to produce a blue coating film, and the film was subjected to film thickness measurement and chromaticity evaluation. As a result, a blue color filter lower in x value, wider in displayable color reproduction range and higher in saturation was obtained in Example 7 than in Comparative Example 13.

Comparative Example 14

A blue curable resin composition was prepared in the same manner as in Example 7 except that 6.0 parts by mass of colorant A3 was used instead of 1.2 parts by mass of colorant A2 and 4.8 parts by mass of colorant A3 used in Example 7. The resulting blue curable resin composition was used to produce a blue coating film, and the film was subjected to film thickness measurement and chromaticity evaluation. As a result, the film thickness was smaller and the intensity was higher in Example 7 than in Comparative Example 14.

Comparative Example 15

A blue curable resin composition was prepared in the same manner as in Example 8 except that 6.0 parts by mass of colorant A2 was used instead of 1.2 parts by mass of colorant A2 and 4.8 parts by mass of colorant A4 used in Example 8. The resulting blue curable resin composition was used to produce a blue coating film, and the film was subjected to film thickness measurement and chromaticity evaluation. As a result, a blue color filter lower in x value, wider in displayable color reproduction range and higher in saturation was obtained in Example 8 than in Comparative Example 15.

Comparative Example 16

A blue curable resin composition was prepared in the same manner as in Example 7 except that 6.0 parts by mass of colorant A4 was used instead of 1.2 parts by mass of colorant A2 and 4.8 parts by mass of colorant A4 used in Example 8. The resulting blue curable resin composition was used to produce a blue coating film, and the film was subjected to film thickness measurement and chromaticity evaluation. As a result, the film thickness was smaller and the intensity was higher in Example 8 than in Comparative Example 16.

The invention claimed is:

1. A blue curable resin composition comprising a colorant (A), a resin (B), a polymerizable compound (C) and a polymerization initiator (D), wherein
    the colorant (A) comprises two or more pigments each having a phthalocyanine backbone,
    the two or more pigments each having the phthalocyanine backbone comprise (a) C.I. Pigment Blue 15, and (b) a pigment selected from the group consisting of C.I. Pigment Blue 15:4 and C.I. Pigment Blue 16,
    wherein the content ratio of (a) C.I. Pigment Blue 15 and (b) a pigment selected from the group consisting of C.I. Pigment Blue 15:4 and C.I. Pigment Blue 16 (C.I. Pigment Blue 15/a pigment selected from the group consisting of C.I. Pigment Blue 15:4 and C.I. Pigment Blue 16) is 0.01 to 20 on a mass basis.

2. A blue color filter formed from the blue curable resin composition according to claim 1.

3. A display device comprising the blue color filter according to claim 1.

4. A blue curable resin composition comprising a colorant (A), a resin (B), a polymerizable compound (C) and a polymerization initiator (D), wherein
- the colorant (A) consists of two or more pigments each having a phthalocyanine backbone so that the two or more pigments each having a phthalocyanine backbone are the only pigments in the composition, and the two or more pigments each having the phthalocyanine backbone comprise (a) C.I. Pigment Blue 15, and (b) a pigment selected from the group consisting of C.I. Pigment Blue 15:4 and C.I. Pigment Blue 16.

* * * * *